(12) United States Patent
Machida

(10) Patent No.: US 7,772,091 B2
(45) Date of Patent: Aug. 10, 2010

(54) MANUFACTURING METHOD OF SEMICONDUCTOR APPARATUS COMPRISING ALIGNMENT PATTERNS IN SCRIBE REGIONS

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/212,169

(22) Filed: Sep. 17, 2008

(65) Prior Publication Data

US 2009/0075457 A1    Mar. 19, 2009

(30) Foreign Application Priority Data

Sep. 18, 2007    (JP) ............................. 2007-241374

(51) Int. Cl.
     *H01L 21/304*    (2006.01)
(52) U.S. Cl. .................. 438/462; 438/113; 438/458; 257/E21.599
(58) Field of Classification Search .................. None
See application file for complete search history.

(56) References Cited

U.S. PATENT DOCUMENTS

| | | | | |
|---|---|---|---|---|
| 6,077,757 A | * | 6/2000 | Mizuno et al. | 438/465 |
| 6,153,941 A | * | 11/2000 | Maejima | 257/797 |
| 6,392,300 B1 | * | 5/2002 | Koike | 257/758 |
| 6,861,344 B2 | * | 3/2005 | Yajima et al. | 438/612 |
| 6,900,532 B1 | * | 5/2005 | Kelkar et al. | 257/698 |
| 7,442,624 B2 | * | 10/2008 | Sarma et al. | 438/462 |
| 2003/0017707 A1 | * | 1/2003 | Yamashita et al. | 438/694 |
| 2008/0076207 A1 | * | 3/2008 | Yamano et al. | 438/108 |
| 2008/0299708 A1 | * | 12/2008 | Tsutsue | 438/121 |

FOREIGN PATENT DOCUMENTS

JP      2002-313985      10/2002

* cited by examiner

*Primary Examiner*—Thanh V Pham
*Assistant Examiner*—Andres Munoz
(74) *Attorney, Agent, or Firm*—Rankin, Hill & Clark LLP

(57) ABSTRACT

Alignment patterns are formed in scribe regions of a semiconductor substrate, and through grooves for exposing the scribe regions are disposed in an insulating layer formed on the semiconductor substrate. Formation positions of wiring patterns are aligned based on the alignment patterns, and a metal layer is patterned and the wiring patterns are formed.

5 Claims, 36 Drawing Sheets

MANUFACTURING METHOD OF SEMICONDUCTOR APPARATUS COMPRISING ALIGNMENT PATTERNS IN SCRIBE REGIONS

TECHNICAL FIELD

The present disclosure relates to a manufacturing method of a semiconductor apparatus. The present disclosure can be applied to a manufacturing method of a semiconductor apparatus in which flip chip bonding between a semiconductor chip and a wiring pattern is made, the semiconductor apparatus having substantially the same size as that of the semiconductor chip in a state of being viewed from the plane.

RELATED ART

A related-art semiconductor apparatus includes a semiconductor apparatus (for example, see FIG. 1) called a chip size package formed in substantially the same size as that of a semiconductor chip in a state of being viewed from the plane.

FIG. 1 is a sectional diagram of a related-art semiconductor apparatus. Referring to FIG. 1, a related-art semiconductor apparatus 100 has a semiconductor chip 101, internal connection terminals 102, a resin layer 103, wiring patterns 104, a solder resist and external connection terminals 107.

The semiconductor chip 101 has a semiconductor substrate 109 formed in a thin plate (for example, polishing or grounding), a semiconductor integrated circuit 111, plural electrode pads 112 and a protective film 113. The semiconductor substrate 109 is, for example, a substrate obtained by individualizing an Si wafer formed in a thin plate.

The semiconductor integrated circuit 111 is disposed on the front side of the semiconductor substrate 109. The semiconductor integrated circuit 111 is constructed of a diffusion layer, an insulating layer, a via and wiring etc. (not shown). The plural electrode pads 112 are disposed on the semiconductor integrated circuit 111. The plural electrode pads 112 are electrically connected to the wiring disposed in the semiconductor integrated circuit 111. The protective film 113 is disposed on the semiconductor integrated circuit 111. The protective film 113 is a film for protecting the semiconductor integrated circuit 111.

The internal connection terminal 102 is disposed on the electrode pad 112. The upper end of the internal connection terminal 102 is exposed from the resin layer 103. The upper end of the internal connection terminal 102 is connected to the wiring pattern 104. The resin layer 103 is disposed so as to cover a surface of the semiconductor chip 101 on which the internal connection terminal 102 is disposed.

The wiring pattern 104 is disposed on the resin layer 103. The wiring pattern 104 is connected to the internal connection terminal 102. The wiring pattern 104 is electrically connected to the electrode pad 112 through the internal connection terminal 102. The wiring pattern 104 has an external connection terminal arrangement region 104A in which the external connection terminal 107 is arranged. The solder resist 106 is disposed on the resin layer 103 so as to cover the portion of the wiring patterns 104 other than the external connection terminal arrangement regions 104A.

FIG. 2 is a plan diagram of a semiconductor substrate in which the related-art semiconductor apparatus is formed. In FIG. 2, C shows a position (hereinafter called a "cut position C") in which a dicer cuts a semiconductor substrate 110. Referring to FIG. 2, the semiconductor substrate 110 has plural semiconductor apparatus formation regions A and scribe regions B for separating the plural semiconductor apparatus formation regions A. The plural semiconductor apparatus formation regions A are a region in which the semiconductor apparatus 100 is formed. The semiconductor substrate 110 is a substrate resulting in the semiconductor substrate 109 (see FIG. 1) described above by being formed in a thin plate and being cut in the cut position C.

FIGS. 3 to 11 are diagrams showing manufacturing steps of the related-art semiconductor apparatus. In FIGS. 3 to 11, the same numerals are assigned to the same components as those of the related-art semiconductor apparatus 100 shown in FIG. 1. Also, in FIGS. 3 to 11, A shows plural semiconductor apparatus formation regions (hereinafter called a "semiconductor apparatus formation region A") and B shows scribe regions for separating the plural semiconductor apparatus formation regions (hereinafter called a "scribe region B") and C shows positions (hereinafter called a "cut position C") in which a dicing blade cuts the semiconductor substrate 110.

First, in a step shown in FIG. 3, a semiconductor chip 101 having a semiconductor integrated circuit 111, plural electrode pads 112 and a protective film 113 is formed on the surface side of the semiconductor substrate 110 before the semiconductor substrate 110 is formed in a thin plate. Also, a pattern (not shown) for alignment used as position reference, for example, at the time of forming the wiring pattern 104 is formed on the semiconductor substrate 110. The alignment pattern can be formed in, for example, the scribe region B of the semiconductor substrate 110 by, for example, Al wiring.

Next, in a step shown in FIG. 4, internal connection terminals 102 are formed on the plural electrode pads 112. In this stage, the plural internal connection terminals 102 have variations in height. Then, in a step shown in FIG. 5, a flat plate 115 is pressed on the plural internal connection terminals 102 and the plural internal connection terminals 102 are made the same height. Then, in a step shown in FIG. 6, a resin layer 103 is formed so as to cover the internal connection terminals 102 and a surface of the semiconductor chip 101 on which the internal connection terminals 102 are formed. Since the resin layer 103 is formed on the whole semiconductor substrate 110, the whole semiconductor substrate 110 including the scribe region B is covered with the resin layer 103.

Then, in a step shown in FIG. 7, the resin layer 103 is polished until an upper surface 102A of the internal connection terminal 102 is exposed from the resin layer 103. At this time, the polishing is performed so that an upper surface 103A of the resin layer 103 is substantially flush with the upper surface 102A of the internal connection terminal 102. Consequently, an upper surface (concretely, the upper surface 103A of the resin layer 103 and the upper surface 102A of the internal connection terminal 102) of a structural body shown in FIG. 7 is formed in a flat surface.

Then, in a step shown in FIG. 8, the wiring patterns 104 are formed on the upper surface of the structural body shown in FIG. 7 formed in the flat surface. Concretely, in the wiring pattern 104, for example, metal foil (not shown) is stuck on the structural body shown in FIG. 7 and then a resist (not shown) is applied so as to cover the metal foil and then this resist is exposed and developed and thereby, a resist film (not shown) is formed on the metal foil of the portion corresponding to a formation region of the wiring pattern 104. Thereafter, the wiring pattern 104 is formed by etching the metal foil using the resist film as a mask (subtractive method). Thereafter, the resist film is removed. An exposure apparatus (not shown) detects a position of the alignment pattern (not shown) formed on the semiconductor substrate 110 and thereby, an exposure region of the resist is determined.

However, the resin layer 103 is formed so as to cover the whole semiconductor substrate 110 in the step shown in FIG.

6, so that the alignment pattern is also covered with the resin layer 103 and the alignment pattern cannot be recognized in the exposure apparatus (not shown) using an inexpensive CCD camera. Therefore, in an expensive exposure apparatus (not shown) having an infrared or X-ray transmission function, the resin layer 103 is transmitted and the alignment pattern is recognized and a resist is exposed.

Then, in a step shown in FIG. 9, a solder resist 106 is formed on the resin layer 103 so as to cover the wiring patterns 104 of the portion other than external connection terminal arrangement regions 104A. Then, in a step shown in FIG. 10, the semiconductor substrate 110 is polished from the back side of the semiconductor substrate 110 and the semiconductor substrate 110 is formed in a thin plate. Then, in a step shown in FIG. 11, external connection terminals 107 are formed in the external connection terminal arrangement regions 104A.

Thereafter, plural semiconductor apparatuses 100 are manufactured by cutting the semiconductor substrate 110 of the portion corresponding to the cut positions C. In this case, the resin layer 103 is formed on the semiconductor substrate 110 of the portion corresponding to the scribe regions B in the step shown in FIG. 6, so that the resin layer 103 is also cut together with the semiconductor substrate 110 (for example, see Patent Reference 1).

[Patent Reference 1] Japanese Patent Unexamined Application Publication No. 2002-313985

However, in the manufacturing method of the related-art semiconductor apparatus 100, accuracy of detection of the alignment pattern is not sufficient in the case of using the exposure apparatus having the infrared or X-ray transmission function, so that accuracy of a formation position of the wiring pattern 104 with respect to the internal connection terminal 102 reduces.

Also, the exposure apparatus having the infrared or X-ray transmission function used in the case of forming a resist film for forming the wiring pattern 104 is expensive, so that a manufacturing cost of the semiconductor apparatus 100 increases.

Further, in the case of manufacturing plural semiconductor apparatuses 100, the resin layer 103 is also cut together with the semiconductor substrate 110 and adhesion of the protective film 113 to the semiconductor chip 101 formed on the semiconductor substrate 110 is not good, so that the interface between the semiconductor chip 101 and the protective film 113 peels and a yield of the semiconductor apparatus 100 reduces.

SUMMARY

Exemplary embodiments of the present invention provide a manufacturing method of a semiconductor apparatus capable of improving accuracy of a formation position of a wiring pattern with respect to an internal connection terminal and also reducing a manufacturing cost of the semiconductor apparatus and further improving a yield of the semiconductor apparatus.

A manufacturing method of a semiconductor apparatus according to an exemplary embodiment comprises:

a semiconductor chip formation step of forming a plurality of semiconductor chips in a plurality of semiconductor chip formation regions of a semiconductor substrate;

an alignment pattern formation step of forming alignment patterns in scribe regions placed between the semiconductor chip formation regions of the semiconductor substrate;

an internal connection terminal formation step of forming internal connection terminals on electrode pads of the semiconductor chips;

an insulating layer formation step of forming an insulating layer having through grooves on the semiconductor substrate on which the semiconductor chips are formed in a state that the through grooves are opposed to the scribe regions of the semiconductor substrate;

a metal layer formation step of forming a metal layer on the insulating layer;

a wiring pattern formation step of aligning formation positions of wiring patterns to be electrically connected to the internal connection terminals based on the alignment patterns and patterning the metal layer based on the formation positions and forming the wiring patterns; and a cutting step of cutting the semiconductor substrate of a portion corresponding to the scribe regions after the wiring pattern formation step.

According to the invention, a through groove for exposing an alignment pattern formed in a scribe region is disposed in an insulating layer formed on a semiconductor substrate, so that the alignment pattern can be recognized by an exposure apparatus using a CCD camera with sufficient detection accuracy of the alignment pattern without using an exposure apparatus having an infrared or X-ray transmission function with insufficient detection accuracy of the alignment pattern, so that accuracy of a formation position of a wiring pattern with respect to an internal connection terminal can be improved.

Also, by disposing the through groove for exposing the alignment pattern formed in the scribe region in the insulating layer formed on the semiconductor substrate, the alignment pattern can be recognized by an exposure apparatus using an inexpensive CCD camera without using an expensive exposure apparatus having an infrared or X-ray transmission function, so that a manufacturing cost of a semiconductor apparatus can be reduced.

Further, by disposing the through groove for exposing the scribe region in the insulating layer formed on the semiconductor substrate, only the semiconductor substrate is cut in a cutting step and a situation in which an interface between a semiconductor chip and a protective film peels is suppressed, so that a yield of the semiconductor apparatus can be improved.

According to the invention, accuracy of a formation position of a wiring pattern with respect to an internal connection terminal can be improved and also a manufacturing cost of a semiconductor apparatus can be reduced and further a yield of the semiconductor apparatus can be improved.

DETAILED DESCRIPTION

Next, embodiments of the invention will be described based on the drawings.

First Embodiment

Figure 1:
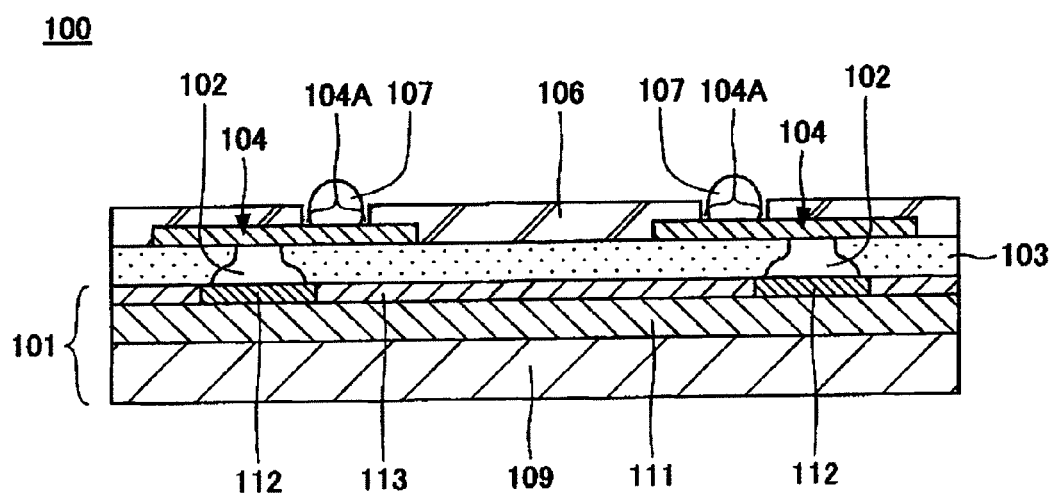
FIG. 1 is a sectional diagram of a related-art semiconductor apparatus.
Figure 2:
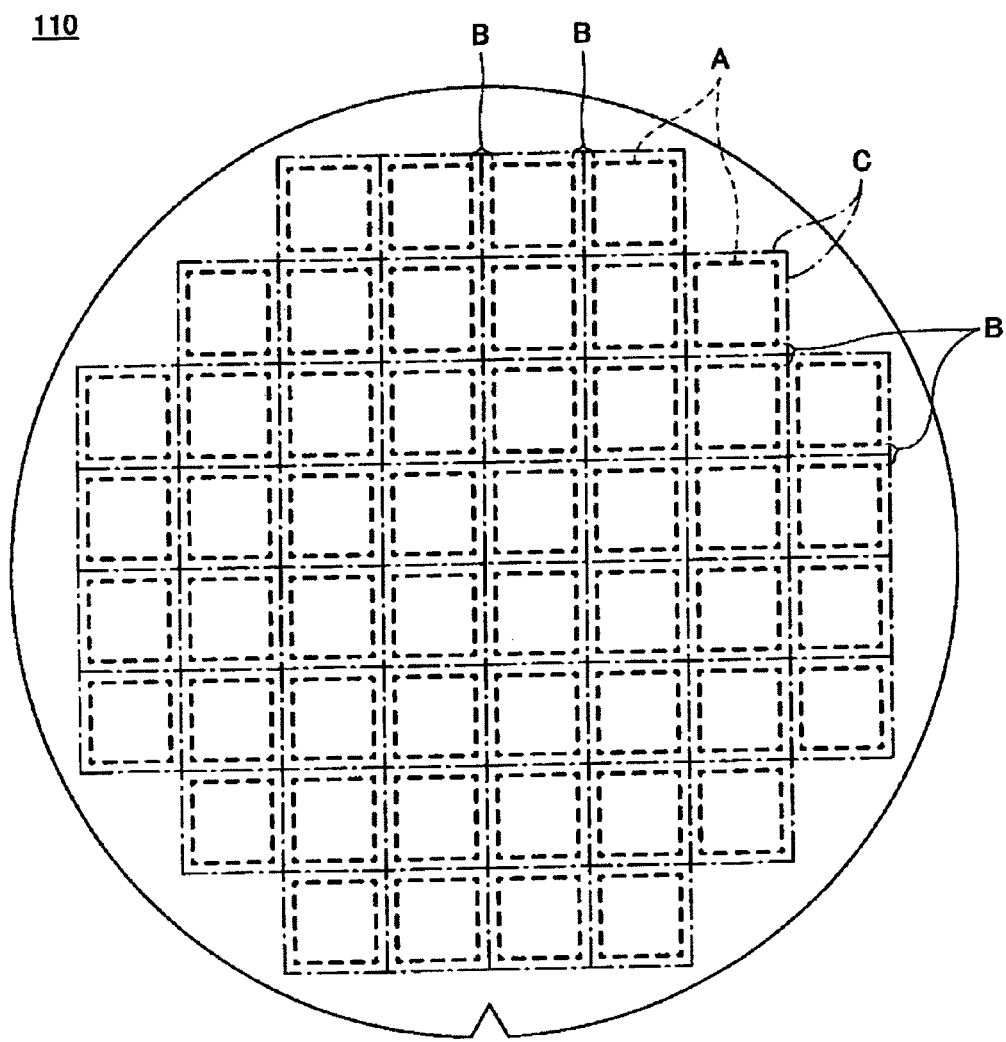
FIG. 2 is a plan diagram of a semiconductor substrate.
Figure 3:
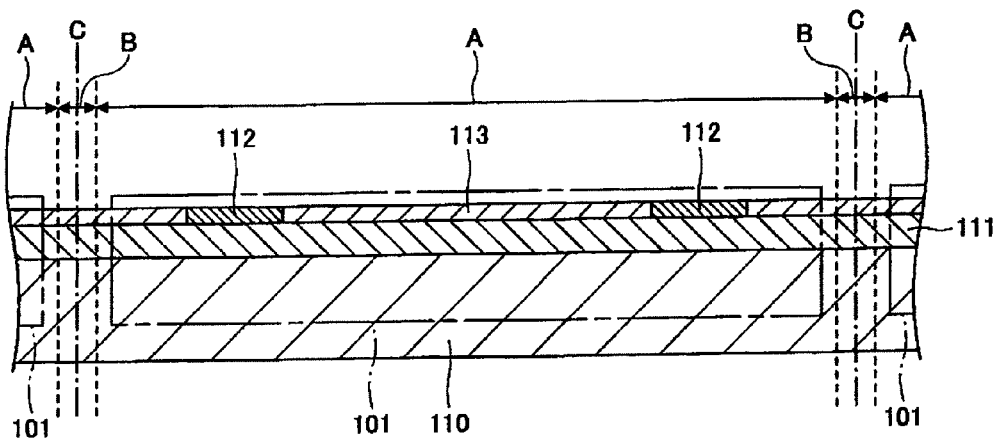
FIG. 3 is a diagram showing a manufacturing step of the related-art semiconductor apparatus (first).
Figure 4:
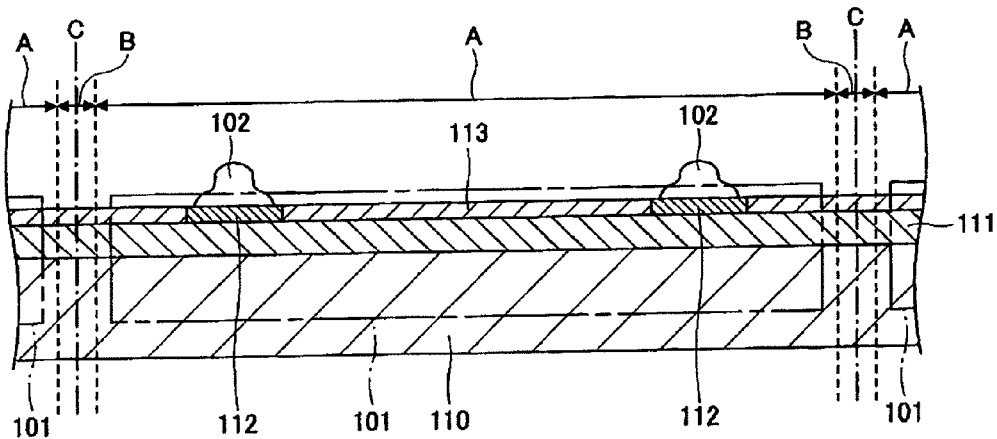
FIG. 4 is a diagram showing a manufacturing step of the related-art semiconductor apparatus (second).
Figure 5:
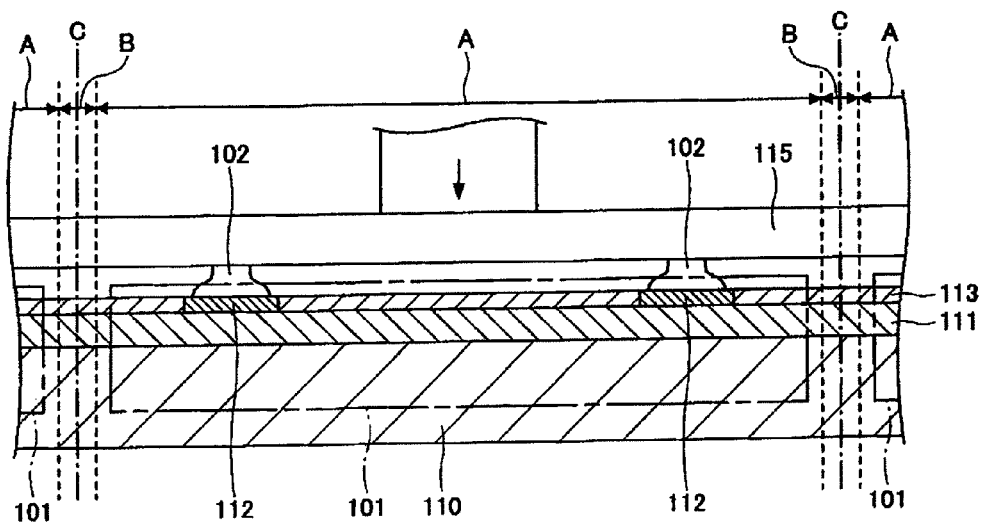
FIG. 5 is a diagram showing a manufacturing step of the related-art semiconductor apparatus (third).
Figure 6:
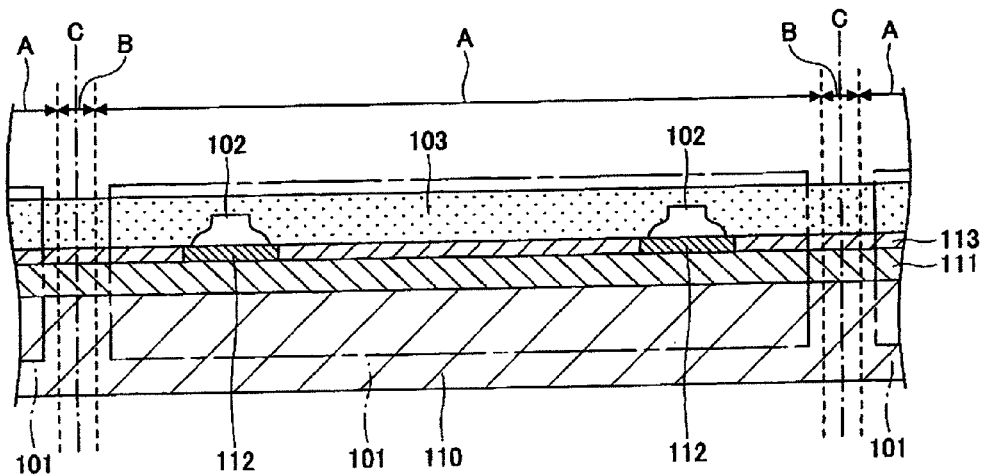
FIG. 6 is a diagram showing a manufacturing step of the related-art semiconductor apparatus (fourth).
Figure 7:
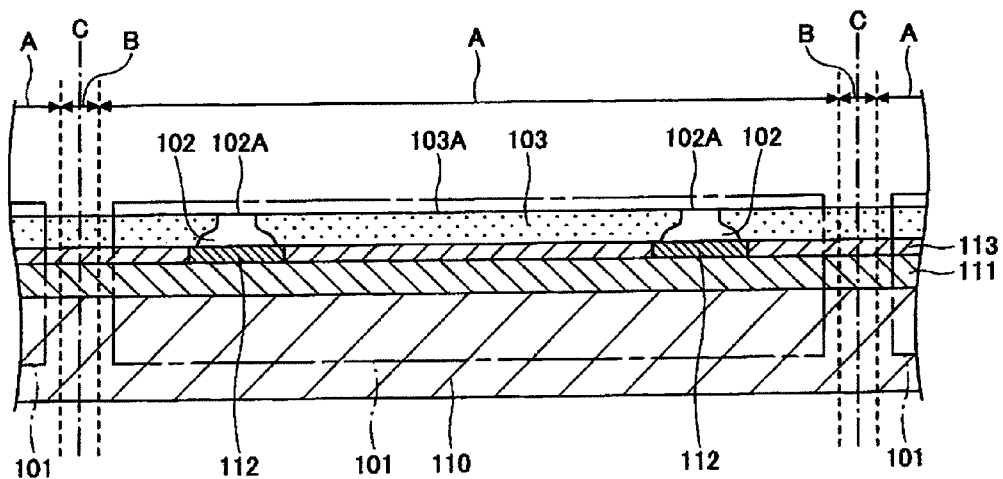
FIG. 7 is a diagram showing a manufacturing step of the related-art semiconductor apparatus (fifth).
Figure 8:
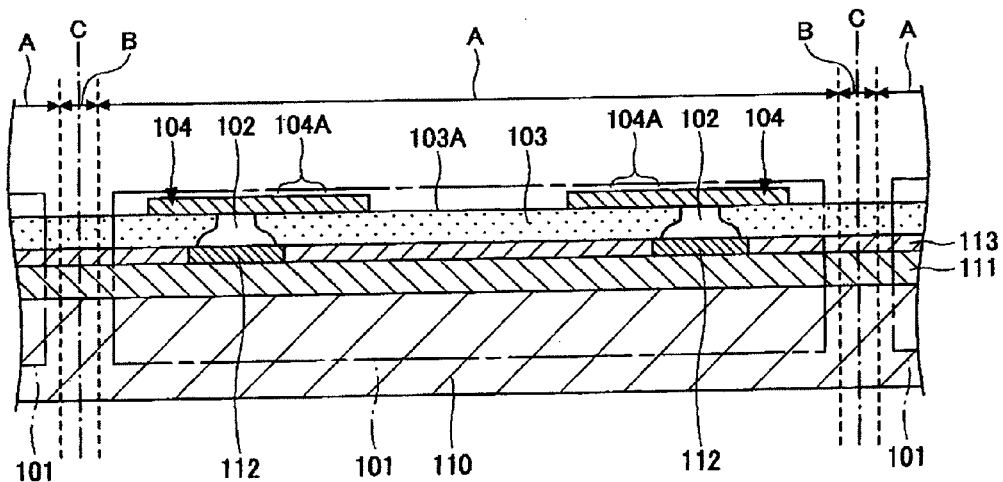
FIG. 8 is a diagram showing a manufacturing step of the related-art semiconductor apparatus (sixth).
Figure 9:
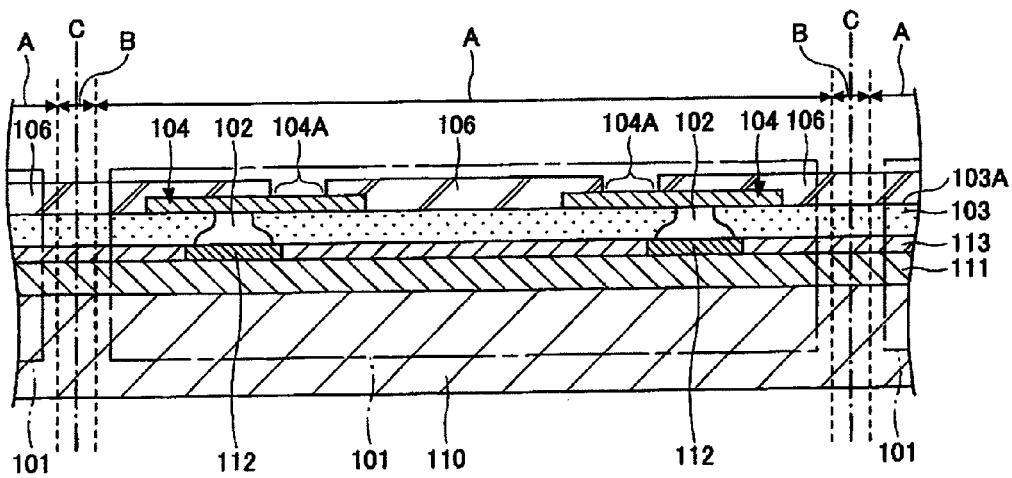
FIG. 9 is a diagram showing a manufacturing step of the related-art semiconductor apparatus (seventh).
Figure 10:
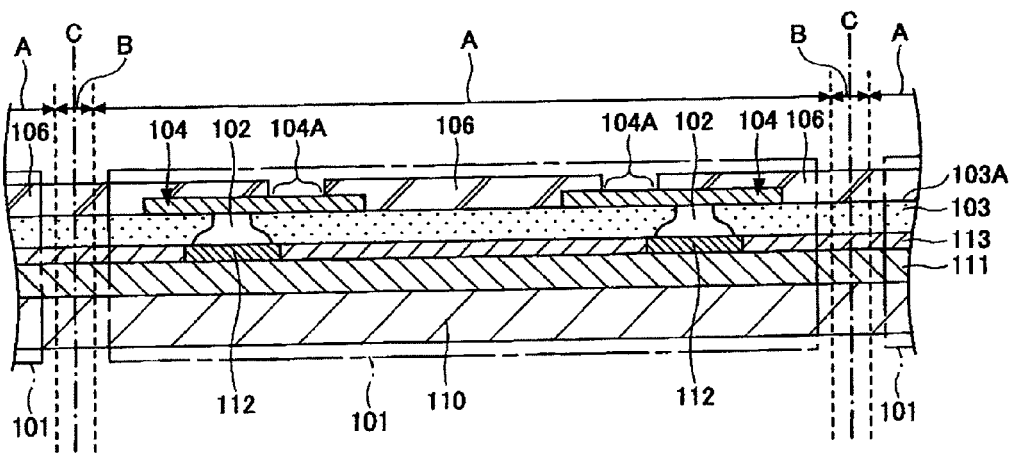
FIG. 10 is a diagram showing a manufacturing step of the related-art semiconductor apparatus (eighth).
Figure 11:
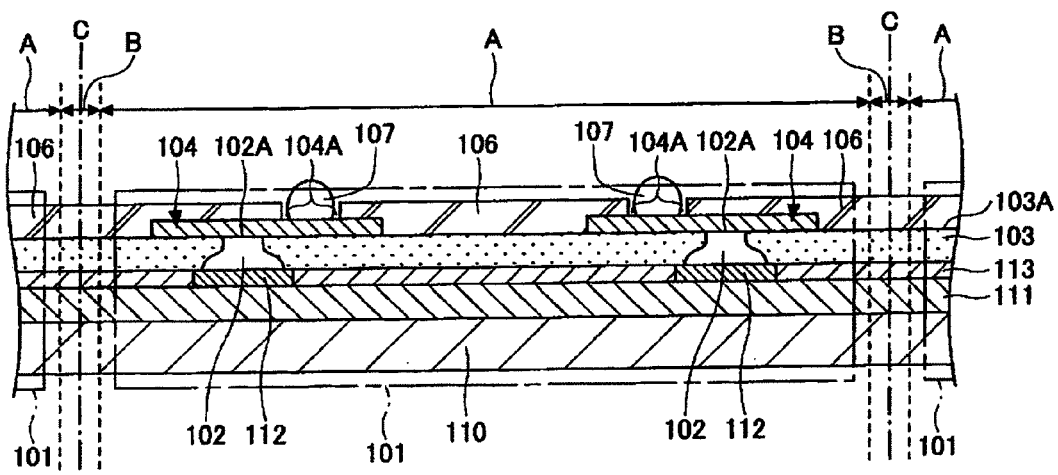
FIG. 11 is a diagram showing a manufacturing step of the related-art semiconductor apparatus (ninth).
Figure 12:
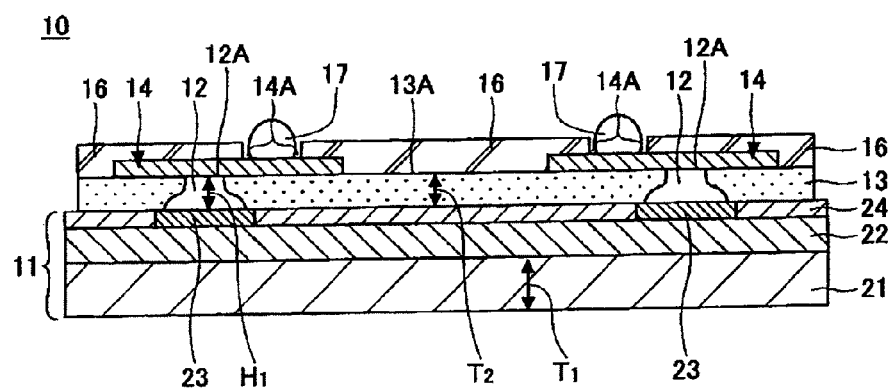
FIG. 12 is a sectional diagram of a semiconductor apparatus according to a first embodiment of the invention.

FIG. 12 is a sectional diagram of a semiconductor apparatus according to a first embodiment of the invention. Referring to FIG. 12, a semiconductor apparatus 10 of the first embodiment has a semiconductor chip 11, internal connection terminals 12, an insulating layer 13, wiring patterns 14, a solder resist 16 and external connection terminals 17.

The semiconductor chip 11 has a semiconductor substrate 21, a semiconductor integrated circuit 22, plural electrode pads 23 and a protective film 24. The semiconductor substrate 21 is a substrate for forming the semiconductor integrated circuit 22. The semiconductor substrate 21 is formed in a thin plate. A thickness $T_1$ of the semiconductor substrate 21 can be set at, for example, 100 μm to 300 μm. The semiconductor substrate 21 is, for example, a substrate obtained by individualizing an Si wafer formed in a thin plate.

The semiconductor integrated circuit 22 is disposed on the front side of the semiconductor substrate 21. The semiconductor integrated circuit 22 is constructed of a diffusion layer (not shown) formed on the semiconductor substrate 21, an insulating layer (not shown) stacked on the semiconductor substrate 21, a via (not shown) disposed in the stacked insulating layer and wiring etc. (not shown).

The plural electrode pads 23 are disposed on the semiconductor integrated circuit 22. The electrode pad 23 is electrically connected to wiring (not shown) disposed in the semiconductor integrated circuit 22. As a material of the electrode pad 23, for example, Al can be used.

The protective film 24 is disposed on the semiconductor integrated circuit 22. The protective film 24 is a film for protecting the semiconductor integrated circuit 22. As the protective film 24, for example, an SiN film or a PSG film can be used.

The internal connection terminal 12 is disposed on the electrode pad 23. The internal connection terminal 12 is means for electrically connecting the semiconductor integrated circuit 22 to the wiring pattern 14. A height $H_1$ of the internal connection terminal 12 can be set at, for example, 10 μm to 60 μm. As the internal connection terminal 12, for example, an Au bump, an Au plated film or a metal film constructed of a Ni film formed by an electroless plating method and an Au film with which its Ni film is covered can be used. The Au bump can be formed by, for example, a bonding method or a plating method.

The insulating layer 13 is disposed so as to cover the semiconductor chip 11 and the portion of the internal connection terminal 12 excluding an upper surface 12A of the internal connection terminal 12. The upper surface 12A of the internal connection terminal 12 is exposed from the insulating layer 13. An upper surface 13A of the insulating layer 13 is made substantially flush with the upper surface 12A of the internal connection terminal 12. As the insulating layer 13, for example, a sheet-shaped insulating layer having sticky properties (for example, an NCF (Non Conductive Film)) or a pasty insulating layer (for example, an NCP (Non Conductive Paste)) can be used. A thickness $T_2$ of the insulating layer 13 can be set at, for example, 10 μm to 60 μm.

The wiring pattern 14 is disposed on the upper surface 13A of the insulating layer 13 so as to make contact with the upper surface 12A of the internal connection terminal 12. The wiring pattern 14 is electrically connected to the semiconductor integrated circuit 22 through the internal connection terminal 12. The wiring pattern 14 has an external connection terminal arrangement region 14A in which the external connection terminal 17 is arranged. As a material of the wiring pattern 14, for example, Cu can be used. A thickness of the wiring pattern 14 can be set at, for example, 12 μm.

The solder resist 16 is disposed on the insulating layer 13 so as to cover the portion of the wiring patterns 14 excluding the external connection terminal arrangement regions 14A.

The external connection terminal 17 is disposed in the external connection terminal arrangement region 14A of the wiring pattern 14. The external connection terminal 17 is a terminal electrically connected to a pad disposed in a mounting substrate (not shown) such as a motherboard. As the external connection terminal 17, for example, a solder bump can be used.

In addition, a step portion generated at the boundary between the semiconductor chip 11 and the insulating layer 13 in an outer peripheral part of the semiconductor apparatus 10 is generated because as described below, a positional deviation of a cut position C from a dicing blade 35 in the case of cutting a semiconductor substrate 31 is considered and even when the positional deviation from the dicing blade 35 occurs, a gap of one side $W_2$ is disposed between a wall surface of a through groove 26 and the dicing blade 35 in order to surely cut only the semiconductor substrate 31 without making contact between the dicing blade 35 and the insulating layer 13 (see FIGS. 27 and 28).

Figure 16:
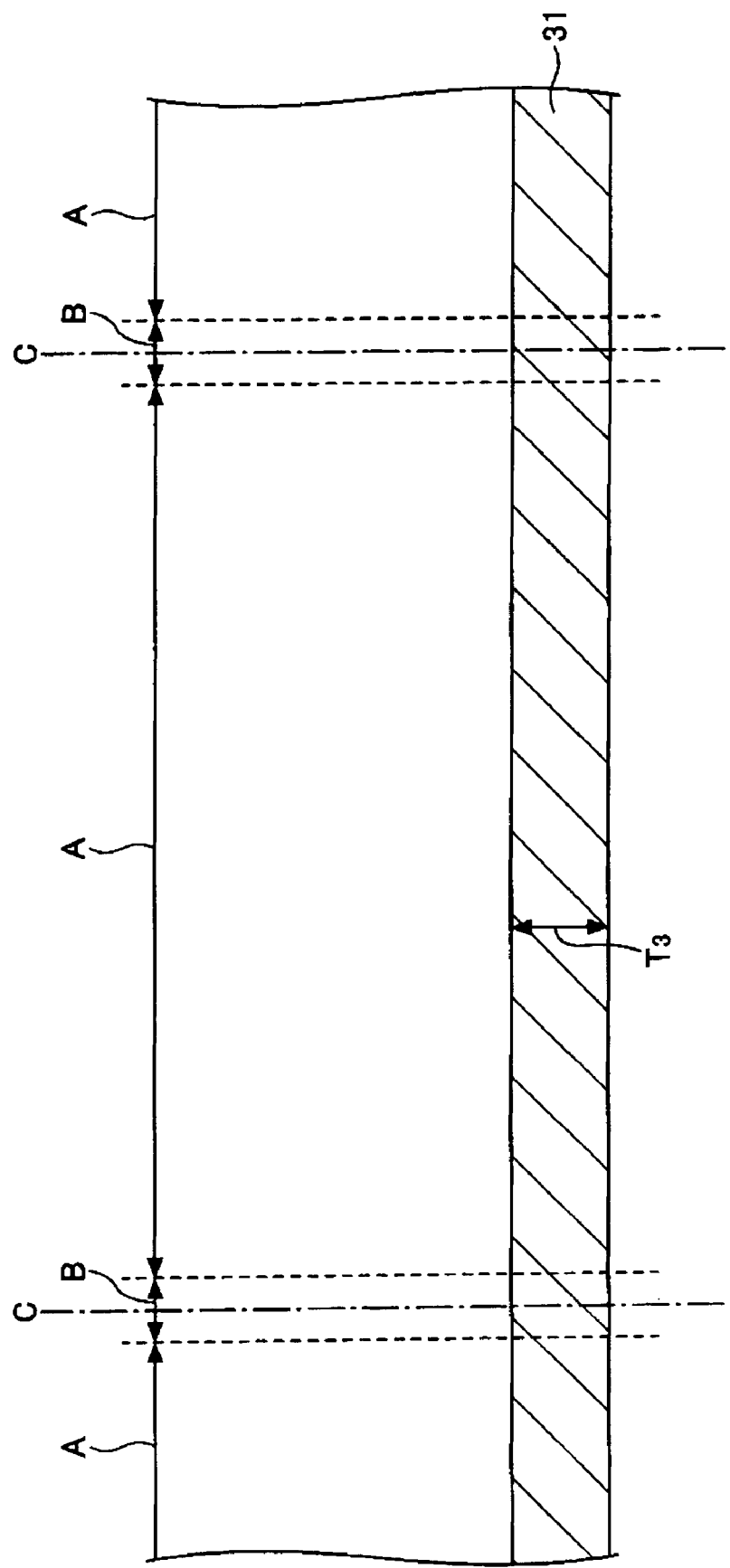
FIG. 16 is a diagram showing a manufacturing step of the semiconductor apparatus according to the first embodiment of the invention (fourth).
Figure 17:
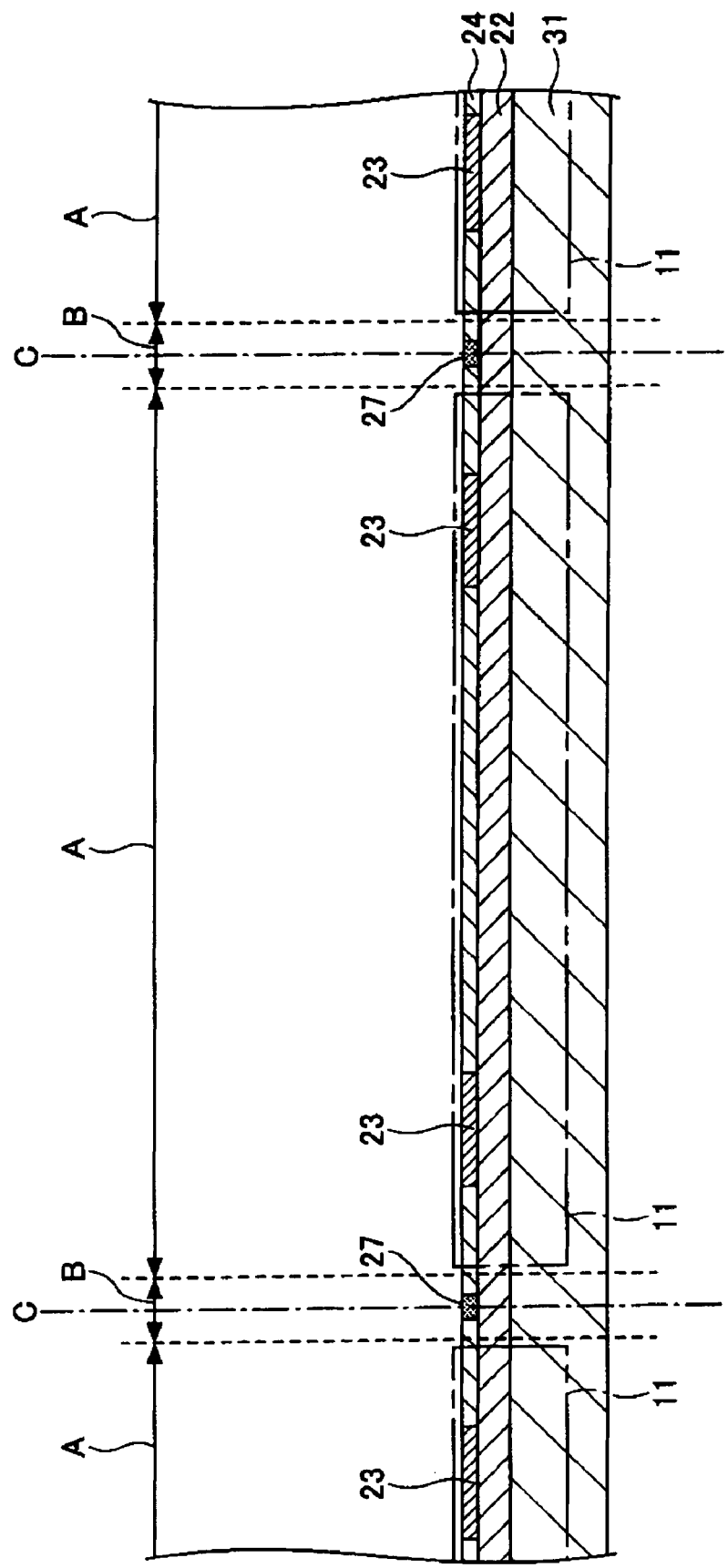
FIG. 17 is a diagram showing a manufacturing step of the semiconductor apparatus according to the first embodiment of the invention (fifth).
Figure 28:
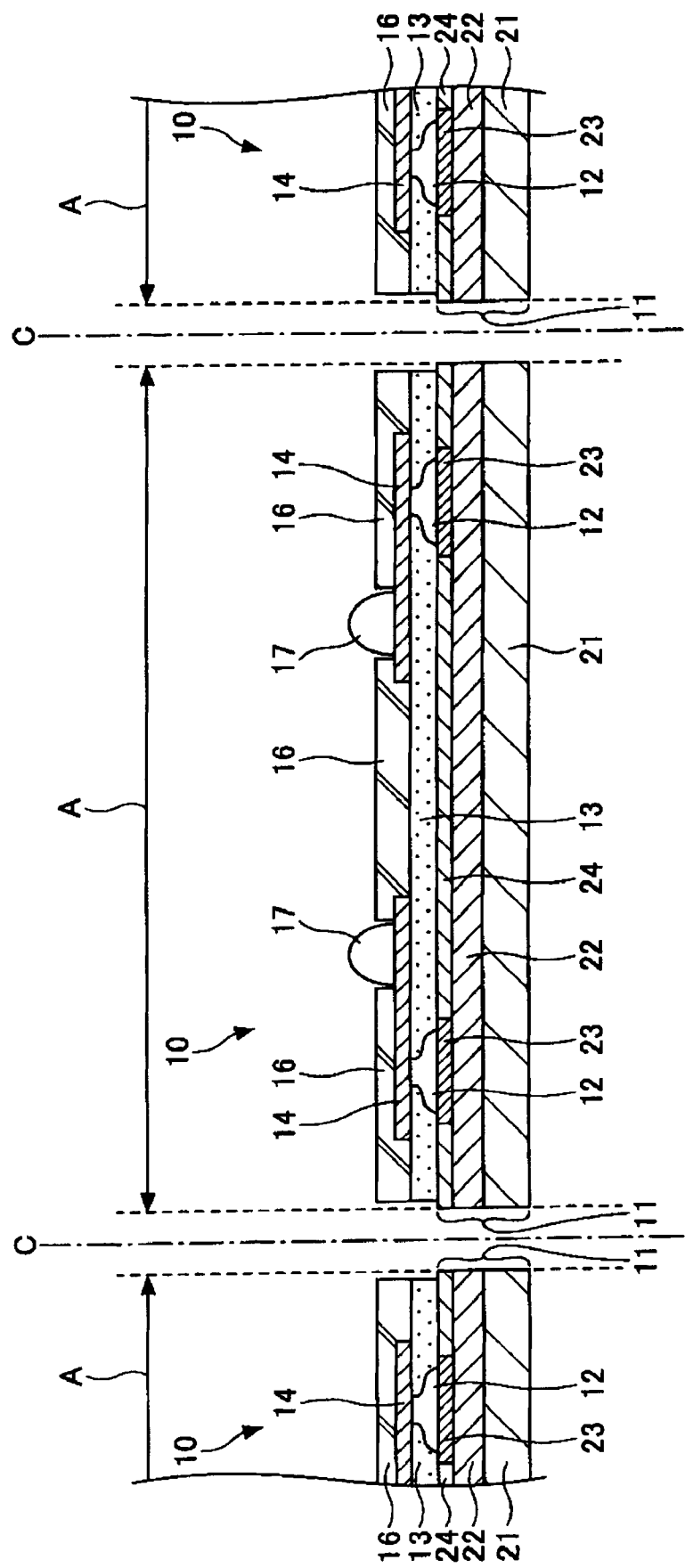
FIG. 28 is a diagram showing a manufacturing step of the semiconductor apparatus according to the first embodiment of the invention (sixteenth).
Figure 29:
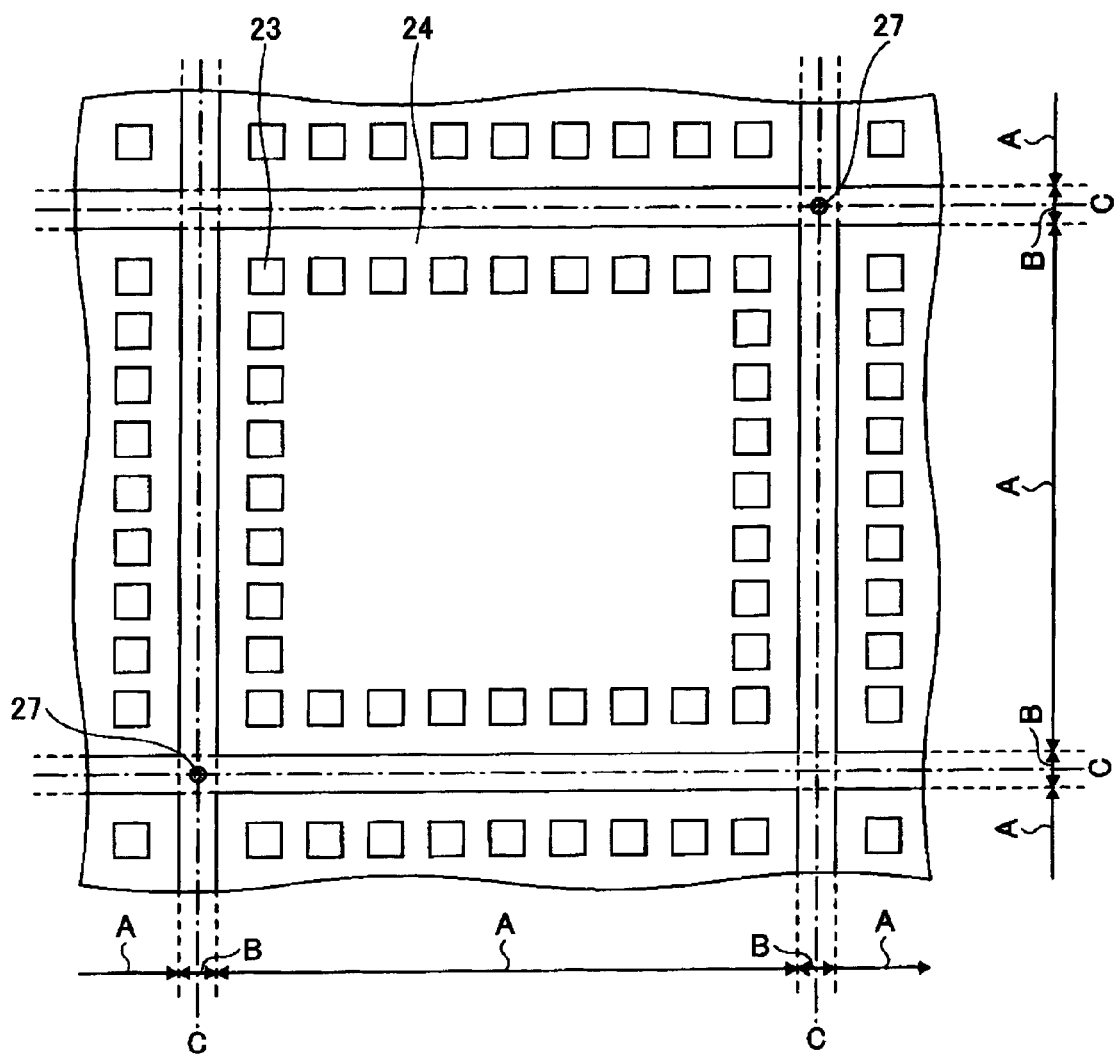
FIG. 29 is a diagram showing an example of an alignment pattern (a plan diagram of the semiconductor apparatus shown in FIG. 17).
Figure 30:
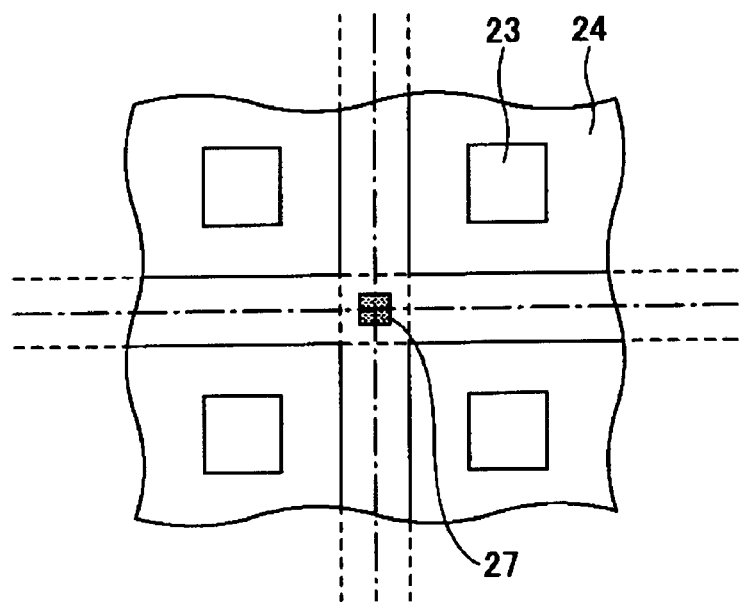
FIG. 30 is a diagram showing another example of an alignment pattern (first).
Figure 31:
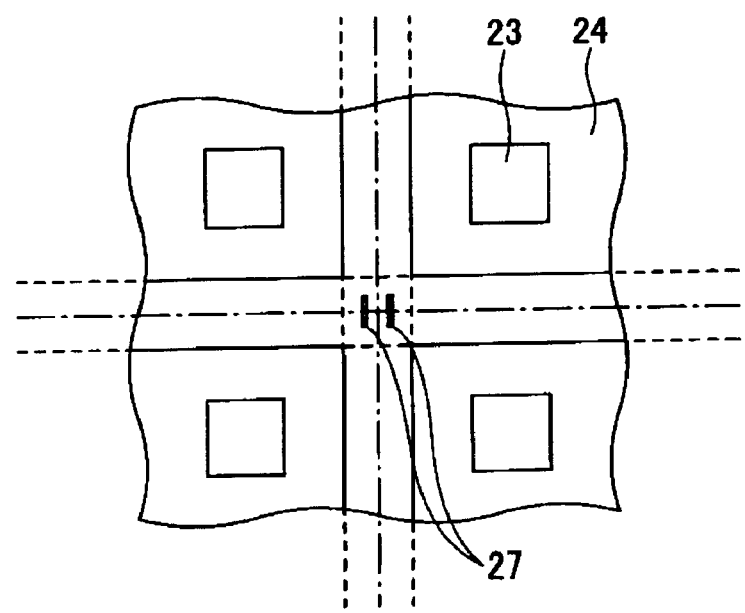
FIG. 31 is a diagram showing other example of an alignment pattern (second).
Figure 32:
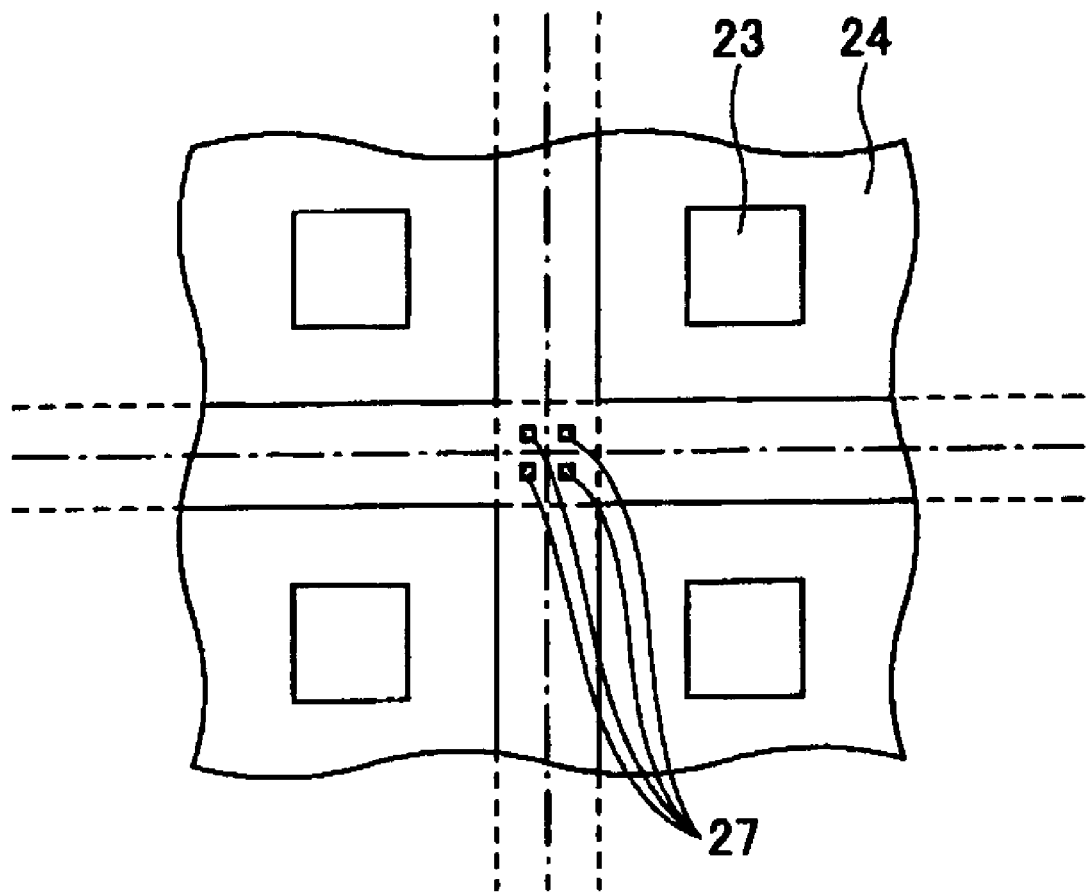
FIG. 32 is a diagram showing other example of an alignment pattern (third).
Figure 33:
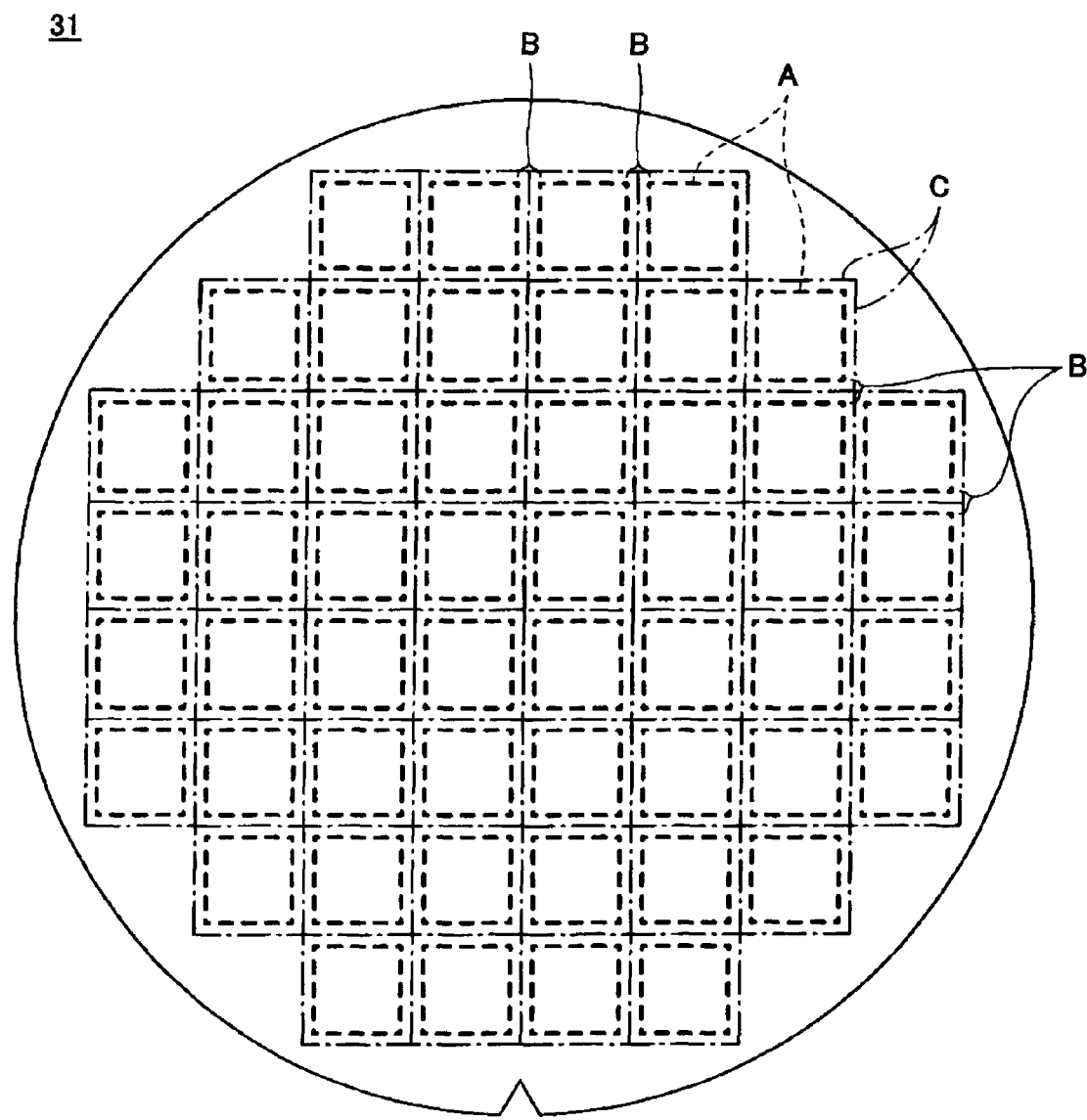
FIG. 33 is a plan diagram of a semiconductor substrate.

FIGS. 13 to 28 are diagrams showing manufacturing steps of the semiconductor apparatus according to the first embodiment of the invention, and FIG. 29 is a diagram showing an example of an alignment pattern (a plan diagram of the semiconductor apparatus shown in FIG. 17). Also, FIGS. 30 to 32 are diagrams showing other examples of alignment patterns, and FIG. 33 is a plan diagram of a semiconductor substrate. In FIGS. 13 to 32, the same numerals are assigned to the same components as those of the semiconductor apparatus 10 of the first embodiment. Also, in FIGS. 16 to 32, A shows plural semiconductor apparatus formation regions (hereinafter called a "semiconductor apparatus formation region A") and B shows scribe regions for separating the plural semiconductor apparatus formation regions (hereinafter called a "scribe region B") and C shows positions (hereinafter called a "cut position C") in which a dicing blade cuts the semiconductor substrate 31.

Figure 13:
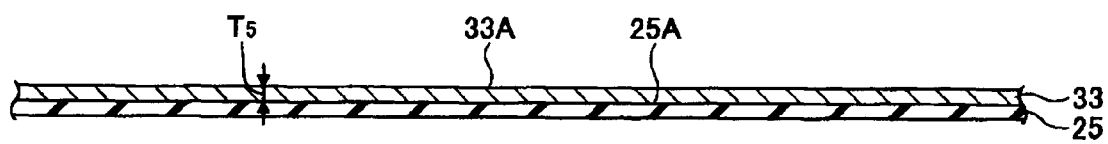
FIG. 13 is a diagram showing a manufacturing step of the semiconductor apparatus according to the first embodiment of the invention (first).

First, in a step shown in FIG. 13, a metal layer 33 is formed on an upper surface 25A of a support body 25. The metal layer 33 is etched and formed in a wiring pattern 14 in a step shown in FIG. 22 described below. Concretely, Cu foil is prepared as the metal layer 33 and this Cu foil is stuck on the upper surface 25A of the support body 25. A thickness $T_5$ of the metal layer 33 can be set at, for example, 10 μm. As the support body 25, for example, a tape such as a dicing tape, a resin plate or a metal plate can be used. Also, any of an optically transparent material and an optically nontransparent material may be used as the support body 25.

Figure 14:
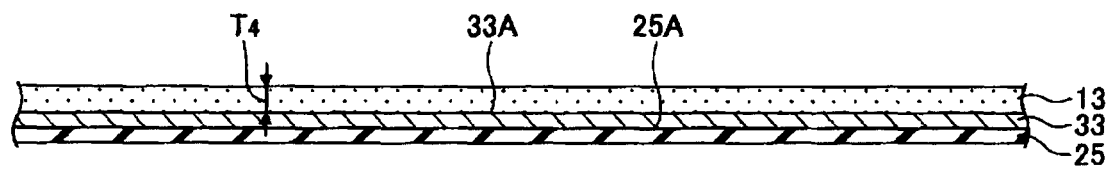
FIG. 14 is a diagram showing a manufacturing step of the semiconductor apparatus according to the first embodiment of the invention (second).

Next, in a step shown in FIG. 14, an insulating layer 13 is formed on an upper surface 33A of the metal layer 33 formed on the upper surface 25A of the support body 25. As the insulating layer 13, a sheet-shaped insulating resin having sticky properties (for example, an NCF (Non Conductive Film)) or a pasty insulating resin (for example, an NCP (Non Conductive Paste)) can be used. In the case of using the sheet-shaped insulating resin having sticky properties, the insulating layer 13 is formed by sticking the sheet-shaped insulating resin on the upper surface 33A of the metal layer 33 of a structural body shown in FIG. 13. Also, in the case of using the pasty insulating resin as the insulating layer 13, a pasty insulating layer 13 is formed on the upper surface 33A of the metal layer 33 of the structural body shown in FIG. 13 by a printing method and thereafter is pre-baked and the insulating layer 13 is partially cured. This partially cured insulating layer 13 has adhesive properties. A thickness $T_4$ of the insulating layer 13 can be set at, for example, 20 μm to 100 μm.

Figure 15:
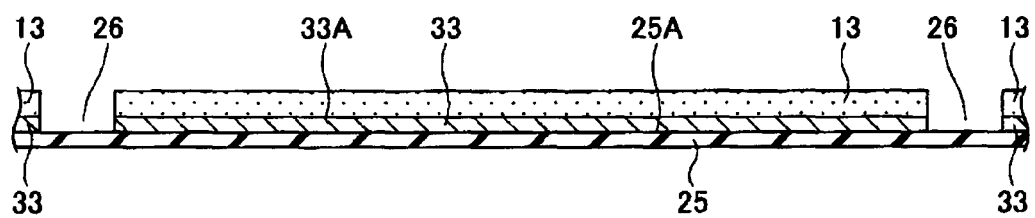
FIG. 15 is a diagram showing a manufacturing step of the semiconductor apparatus according to the first embodiment of the invention (third).

Then, in a step shown in FIG. 15, the insulating layer 13 and the metal layer 33 of a structural body shown in FIG. 14 are pre-cut by, for example, dicing processing and through grooves 26 are disposed. The through groove 26 is disposed in a position in which a scribe region B in which an alignment pattern 27 disposed in the semiconductor substrate 31 is formed is exposed in a step shown in FIG. 20 described below.

Figure 19:
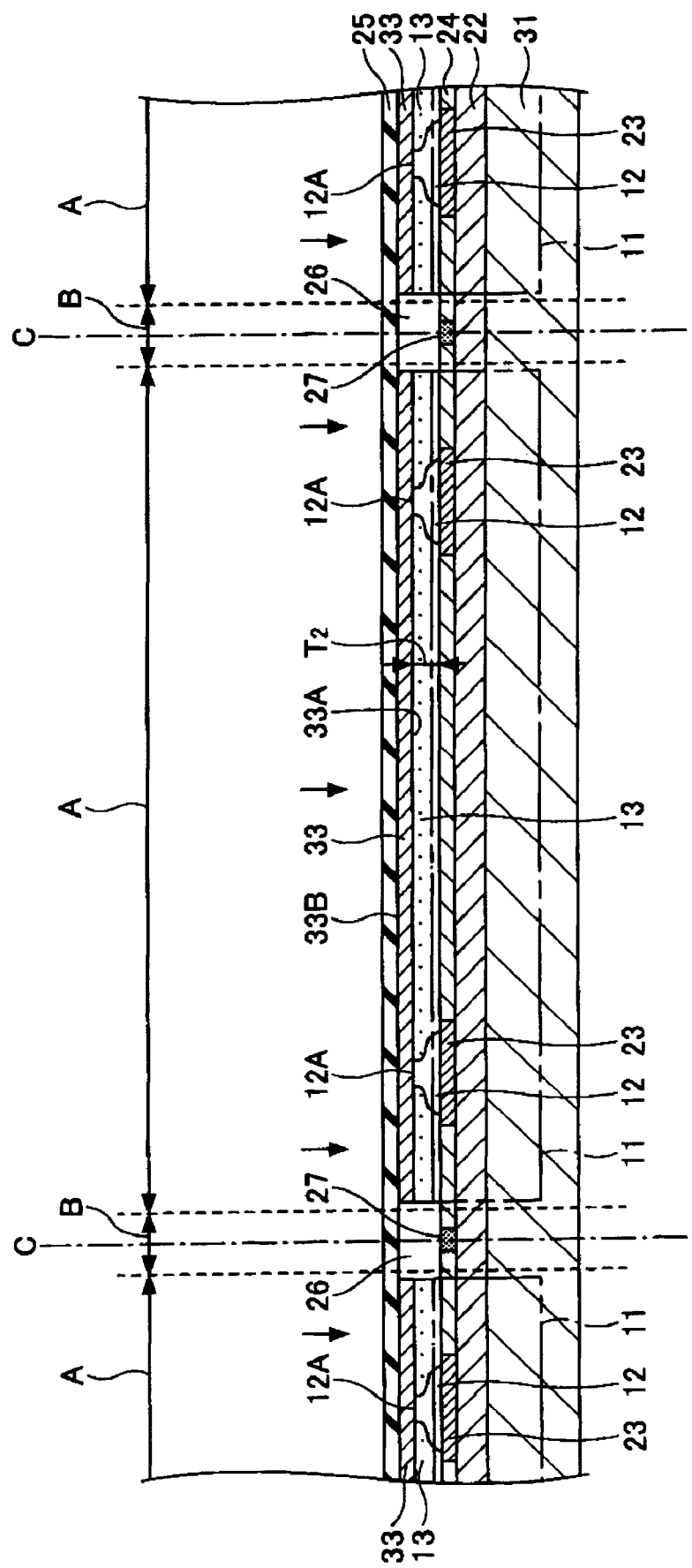
FIG. 19 is a diagram showing a manufacturing step of the semiconductor apparatus according to the first embodiment of the invention (seventh).

By disposing the through groove 26 corresponding to the scribe region B in which the alignment pattern 27 is formed in the metal layer 33 and the insulating layer 13 thus, the alignment pattern 27 can be recognized from the front side (side in which a semiconductor integrated circuit 22 is formed) of the semiconductor apparatus 10 even after a semiconductor chip 11 and the insulating layer 13 are stuck together in a step of FIG. 19.

Then, in a step shown in FIG. 16, a semiconductor substrate 31 having plural semiconductor apparatus formation regions A and scribe regions B for separating the plural semiconductor apparatus formation regions A is prepared (see FIG. 33). The semiconductor substrate 31 is formed in a thin plate and is cut in cut positions C and thereby, results in the semiconductor substrate 21 (see FIG. 12) described previously. As the semiconductor substrate 31, for example, an Si wafer can be used. A thickness $T_3$ of the semiconductor substrate 31 can be set at, for example, 500 μm to 775 μm.

Then, in a step shown in FIG. 17, a semiconductor chip 11 having a semiconductor integrated circuit 22, electrode pads 23 and a protective film 24 is formed on the front side of the semiconductor substrate 31 corresponding to the semiconductor apparatus formation regions A by a well-known technique (a semiconductor chip formation step). As a material of the electrode pad 23, for example, Al can be used. Also, as the protective film 24, for example, an SiN film or a PSG film can be used.

Also, in the step shown in FIG. 17, the alignment pattern 27 is formed in the scribe region B (a formation step of the alignment pattern). The alignment pattern 27 is recognized by an exposure apparatus, for example, at the time of forming a wiring pattern and is a mark used as position reference. As shown in FIG. 29, the alignment pattern 27 is formed in, for example, a diagonal position of the semiconductor apparatus 10 of the scribe region B of the semiconductor substrate 31. Also, the alignment pattern 27 may be formed in, for example, four corners of the semiconductor apparatus 10.

The alignment pattern 27 may have, for example, a circular cylinder shape as shown in FIG. 29, but may have a quadrangular prism shape as shown in FIG. 30, a quadrangular prism shape formed in a rectangle in the case of being viewed from the plane as shown in FIG. 31, four quadrangular prism shapes placed so as to form a cross as shown in FIG. 32, etc. and may have shapes other than the shapes shown in FIGS. 29 to 32 as long as the pattern has a shape capable of being recognized by the exposure apparatus or a sticking apparatus. Also, as the alignment pattern 27, for example, a single layer of an Al layer, a Cu layer or a Ti layer, or a layer obtained by stacking at least two of these layers can be used. Also, a width of the scribe region B can be set at, for example, 0.2 mm. In this case, the alignment pattern 27 can be formed in, for example, a circular cylinder (for example, a diameter of 0.1 mm). By forming the electrode pad 23 and the alignment pattern 27 in the same step thus, the manufacturing steps can be reduced, so that a manufacturing cost of the semiconductor apparatus 10 can be reduced. In addition, the electrode pad 23 and the alignment pattern 27 may be formed in different steps.

Figure 18:
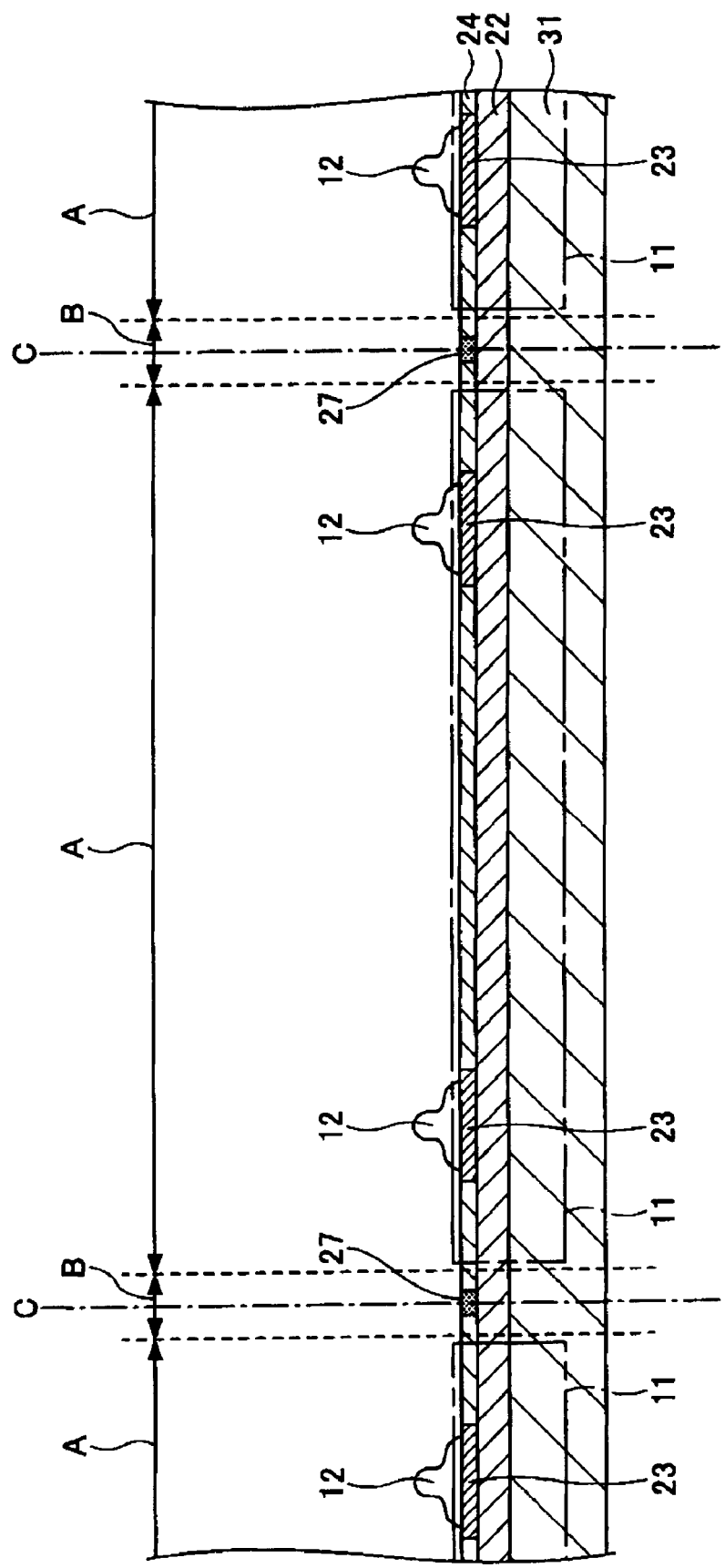
FIG. 18 is a diagram showing a manufacturing step of the semiconductor apparatus according to the first embodiment of the invention (sixth).

Then, in a step shown in FIG. 18, internal connection terminals 12 are respectively formed on the plural electrode pads 23 disposed in the plural semiconductor apparatus formation regions A (an internal connection terminal formation step). As the internal connection terminal 12, for example, an Au bump, an Au plated film or a metal film constructed of a Ni film formed by an electroless plating method and an Au film formed on the Ni film can be used. The Au bump can be formed by, for example, a bonding method. In addition, variations in height are present in the plural internal connection terminals 12 formed in the step shown in FIG. 18.

Then, in a step shown in FIG. 19, the insulating layer 13 is stuck on the semiconductor chip 11 so that a surface of the support body 25 (structural body shown in FIG. 15) on which the metal layer 33 and the insulating layer 13 are formed is opposed to a surface of the semiconductor substrate 31 (structural body shown in FIG. 18) on which the plural semiconductor chips 11 are formed. In this case, the insulating layer 13 is stuck on the semiconductor chip 11 in a position in which the through grooves 26 of the structural body shown in FIG. 15 expose the scribe regions B of the structural body shown in FIG. 18. In the case of alignment between the scribe region B and the through groove 26, the alignment pattern 27 may be recognized by a sticking apparatus and the alignment between the scribe region B and the through groove 26 may be performed with reference to the alignment pattern 27. By together sticking the structural body shown in FIG. 15 on the structural body shown in FIG. 18 with reference to the alignment pattern 27, accuracy of a position of the through groove 26 with respect to the scribe region B can be improved.

Here, the alignment pattern 27 is covered with the support body 25, so that a sticking apparatus without having a special function can be used when the support body 25 is made of an optically transparent material, but a special sticking apparatus having a transmission function using infrared rays or X rays is required when the support body 25 is made of an optically nontransparent material.

After sticking together, in a state of heating a structural body shown in FIG. 19, the support body 25 is pressed in an arrow direction and the upper surface 33A of the metal layer 33 is brought into contact with upper surfaces 12A of the plural internal connection terminals 12 and the metal layer 33 is crimped on the internal connection terminals 12. Also, the insulating layer 13 cures by heating the structural body shown in FIG. 19. A thickness $T_2$ of the insulating layer 13 after crimping can be set at, for example, 10 μm to 60 μm.

Figure 20:
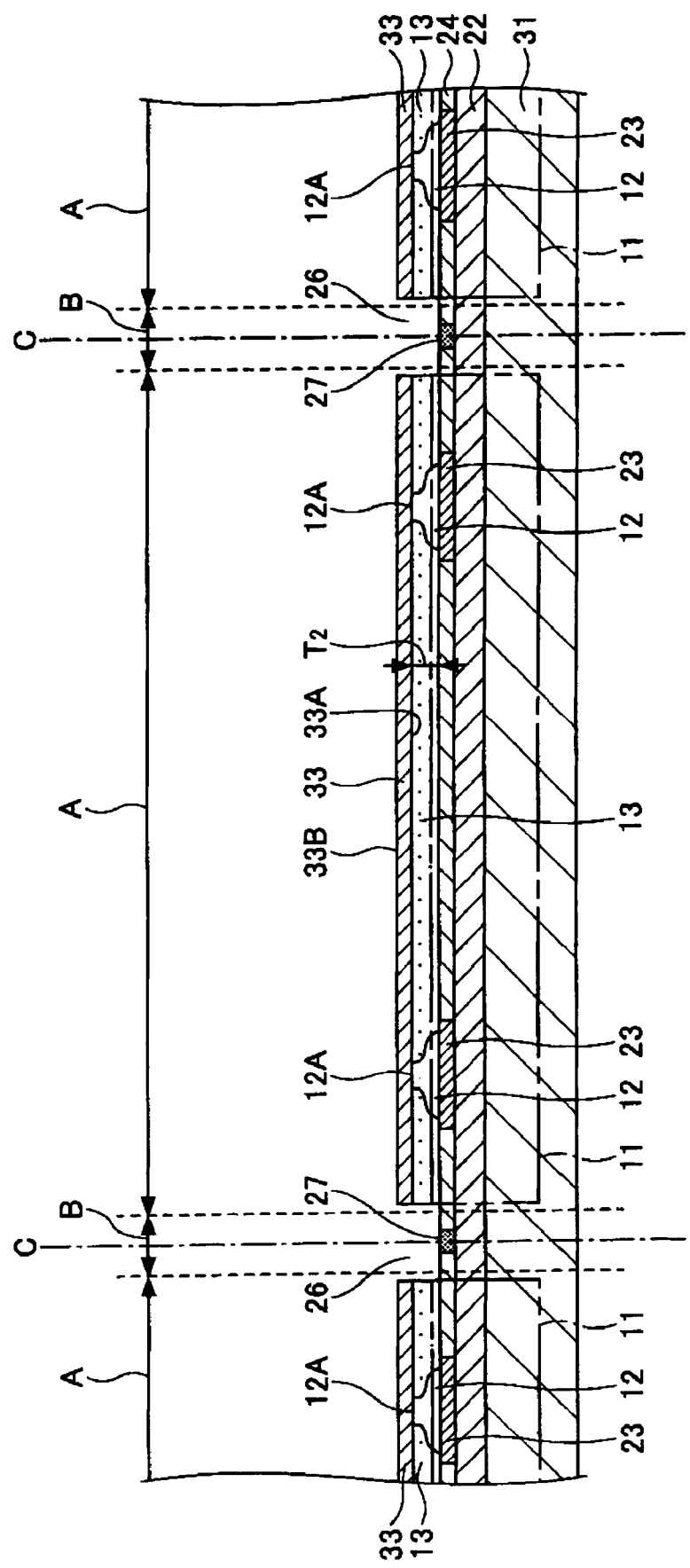
FIG. 20 is a diagram showing a manufacturing step of the semiconductor apparatus according to the first embodiment of the invention (eighth).

Then, in a step shown in FIG. 20, the support body 25 shown in FIG. 19 is removed. Since the through groove 26 is positioned on the scribe region B, the alignment pattern 27 can be recognized from the front side (side in which the semiconductor integrated circuit 22 is formed) of the semiconductor apparatus 10. That is, an expensive special exposure apparatus having a transmission function using X rays or infrared rays in which accuracy of recognition of the alignment pattern 27 is reduced is not required and an inexpensive exposure apparatus using a CCD camera can be used, so that the alignment pattern 27 can be recognized with high accuracy.

Figure 21:
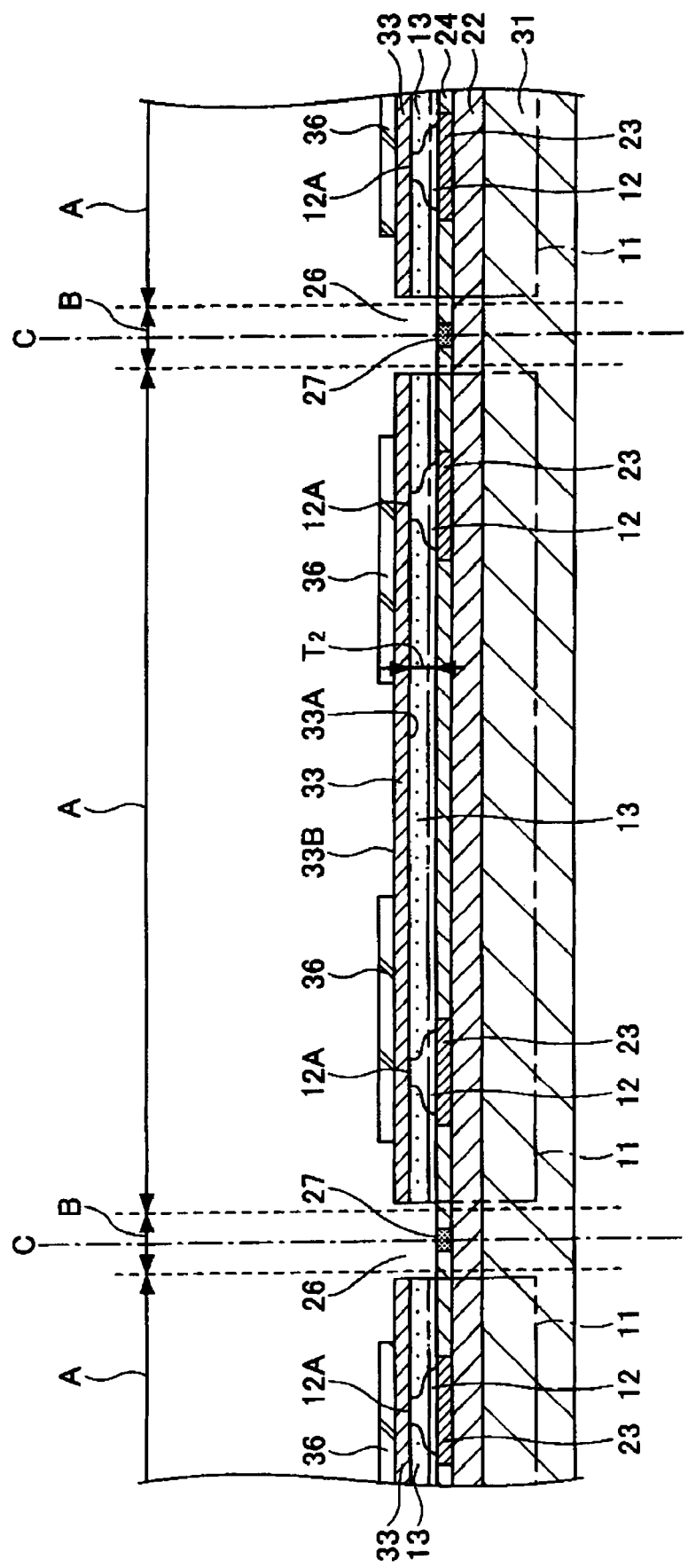
FIG. 21 is a diagram showing a manufacturing step of the semiconductor apparatus according to the first embodiment of the invention (ninth).

Then, in a step shown in FIG. 21, a resist is applied to the metal layer 33 and then this resist is exposed and developed and thereby, a resist film 36 is formed on the metal layer 33 of the portion corresponding to a formation region of the wiring pattern 14. An exposure apparatus detects a position of the alignment pattern 27 and thereby, an exposure region of the resist film 36 is determined.

Figure 22:
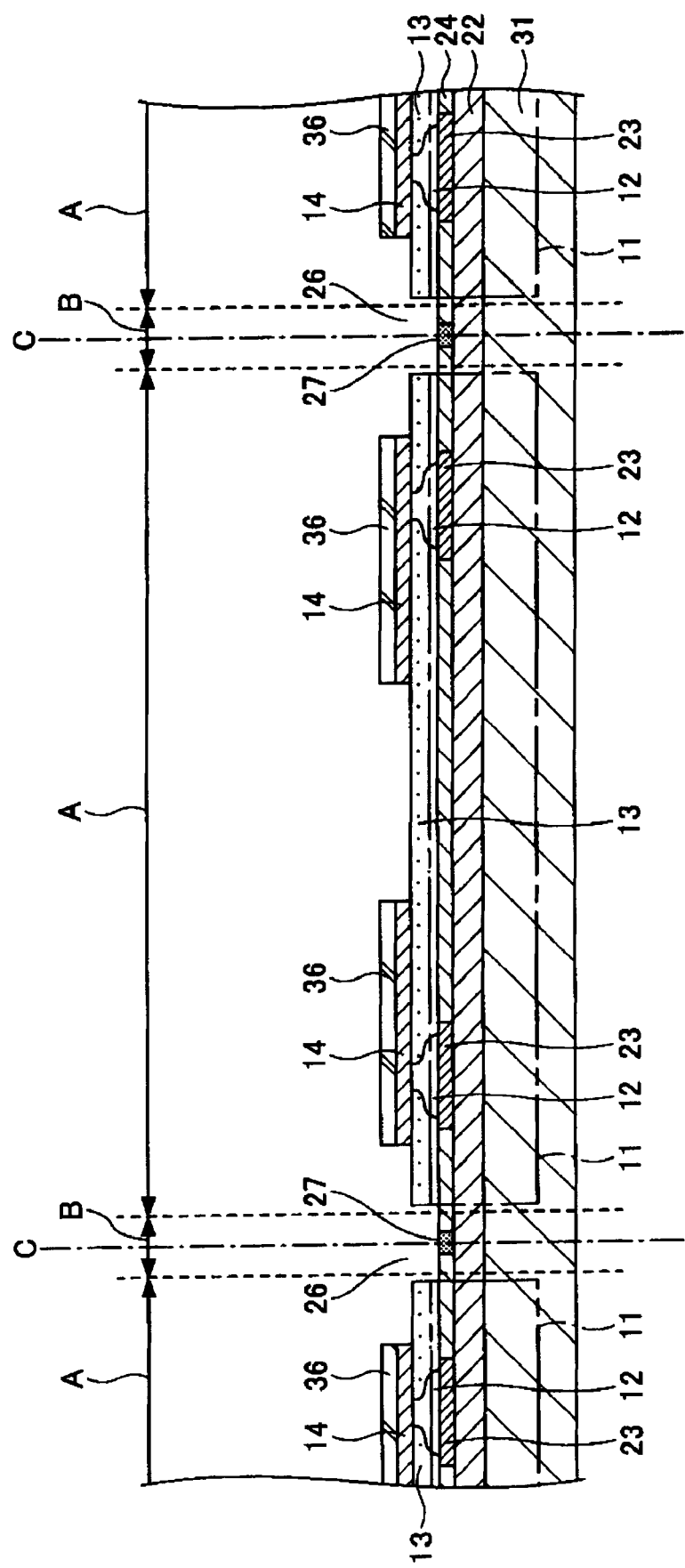
FIG. 22 is a diagram showing a manufacturing step of the semiconductor apparatus according to the first embodiment of the invention (tenth).

Then, in a step shown in FIG. 22, the metal layer 33 is etched using the resist film 36 as a mask and the metal layer 33 of the portion in which the resist film 36 is not formed in FIG. 21 is removed and thereby, the wiring patterns 14 are formed (a wiring pattern formation step). As shown in FIGS. 20 to 22, an example of forming the wiring patterns 14 by a subtractive method is shown in the embodiment.

Figure 23:
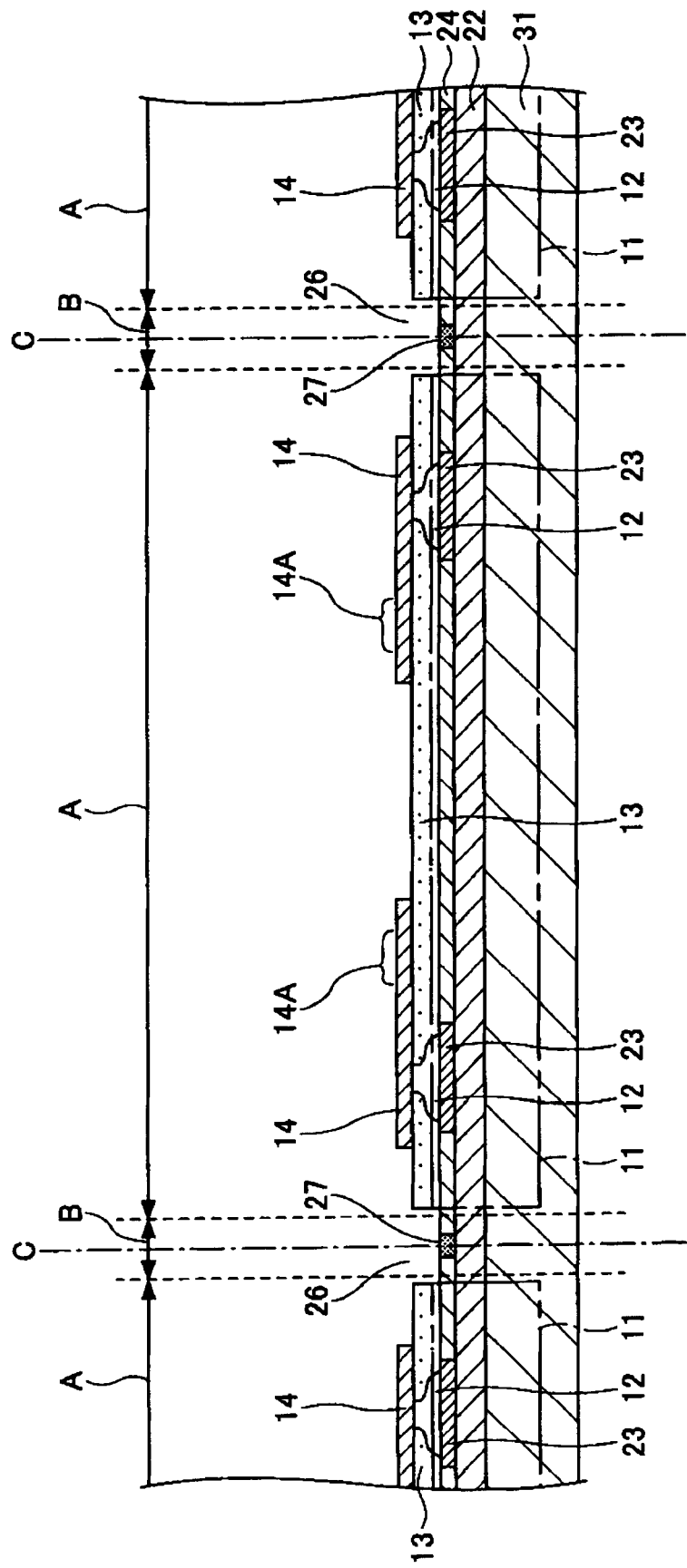
FIG. 23 is a diagram showing a manufacturing step of the semiconductor apparatus according to the first embodiment of the invention (eleventh).

Then, in a step shown in FIG. 23, the resist film 36 shown in FIG. 22 is removed. Thereafter, roughening treatment of the wiring pattern 14 is performed. The roughening treatment of the wiring pattern 14 can be performed by any method of blackening treatment or roughening etching treatment. The roughening treatment is treatment for improving adhesion between the wiring pattern 14 and a solder resist 16 formed on a side surface and an upper surface of the wiring pattern 14.

Since the through groove 26 for exposing the alignment pattern 27 formed in the scribe region B is disposed in the insulating layer 13 formed on the semiconductor substrate 31, the alignment pattern 27 can be recognized with high accuracy by an exposure apparatus using a CCD camera, so that accuracy of a formation position of the wiring pattern 14 with respect to the internal connection terminal 12 can be improved. Also, the alignment pattern 27 can be recognized by the exposure apparatus using an inexpensive CCD camera without using an expensive exposure apparatus having an infrared or X-ray transmission function, so that a manufacturing cost of the semiconductor apparatus can be reduced.

Figure 24:
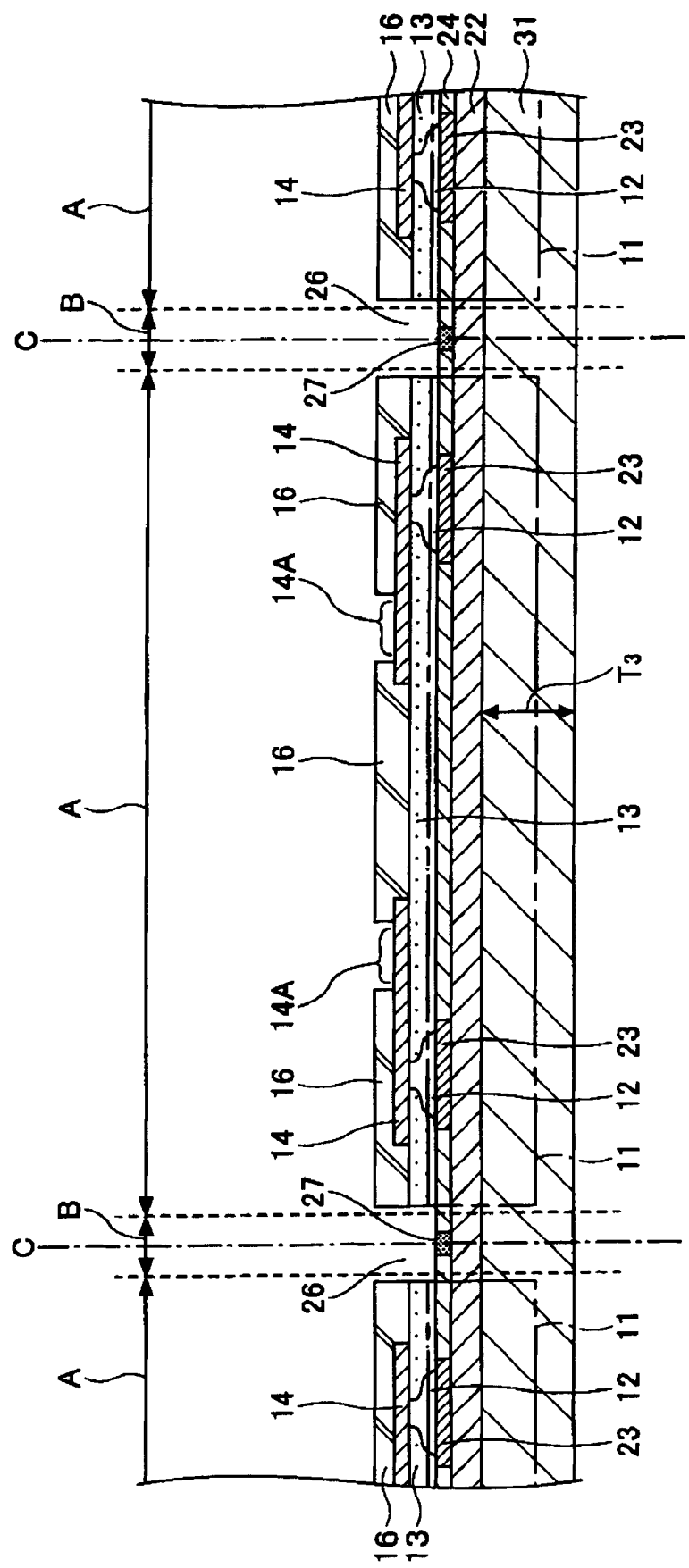
FIG. 24 is a diagram showing a manufacturing step of the semiconductor apparatus according to the first embodiment of the invention (twelfth).

Then, in a step shown in FIG. 24, the solder resist 16 is formed so as to cover the insulating layer 13 and the portion of the wiring patterns 14 excluding the scribe regions B and external connection terminal arrangement regions 14A.

Figure 25:
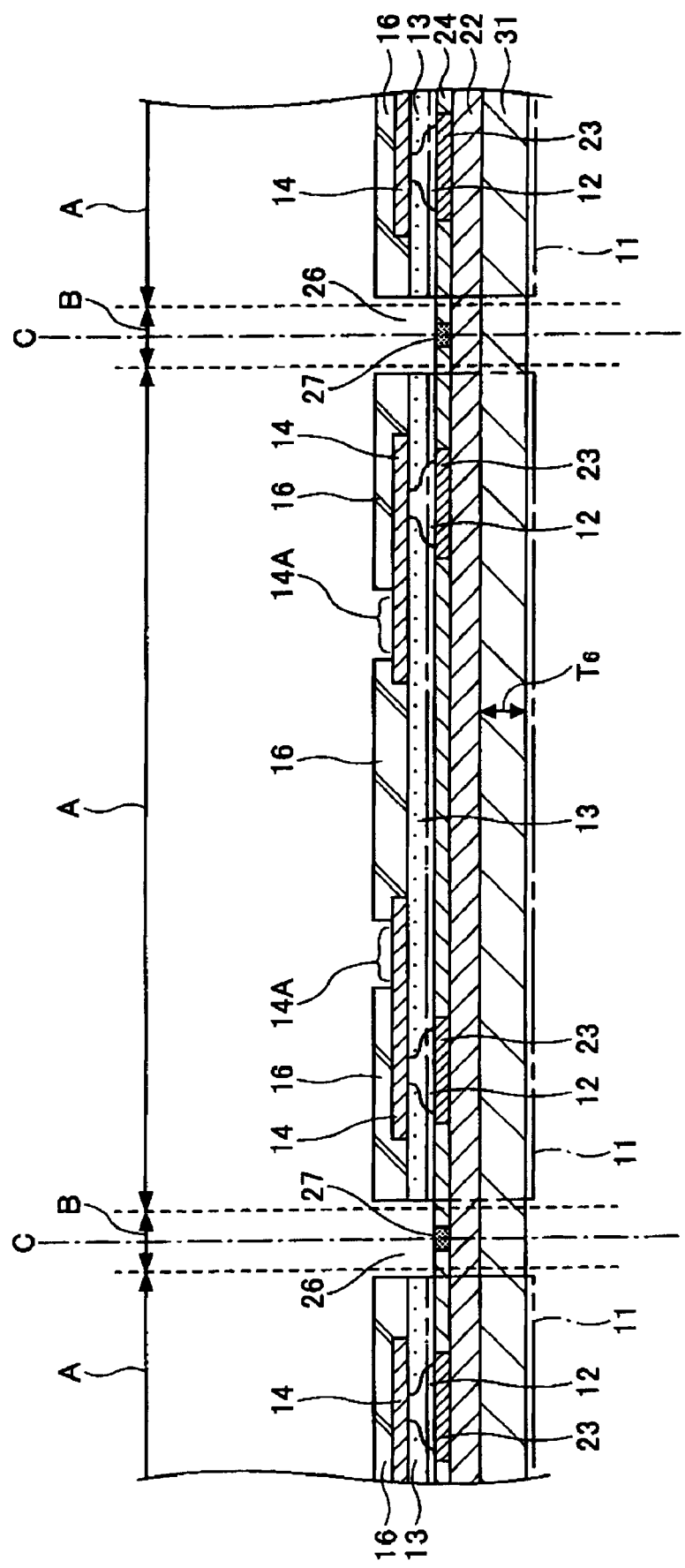
FIG. 25 is a diagram showing a manufacturing step of the semiconductor apparatus according to the first embodiment of the invention (thirteenth).

Then, in a step shown in FIG. 25, the semiconductor substrate 31 is polished or ground from the back side of the semiconductor substrate 31 and the semiconductor substrate 31 is formed in a thin plate. In the thin plate formation of the semiconductor substrate 31, for example, a back side grinder can be used. A thickness $T_6$ of the semiconductor substrate 31 after the thin plate formation can be set at, for example, 100 μm to 300 μm.

Figure 26:
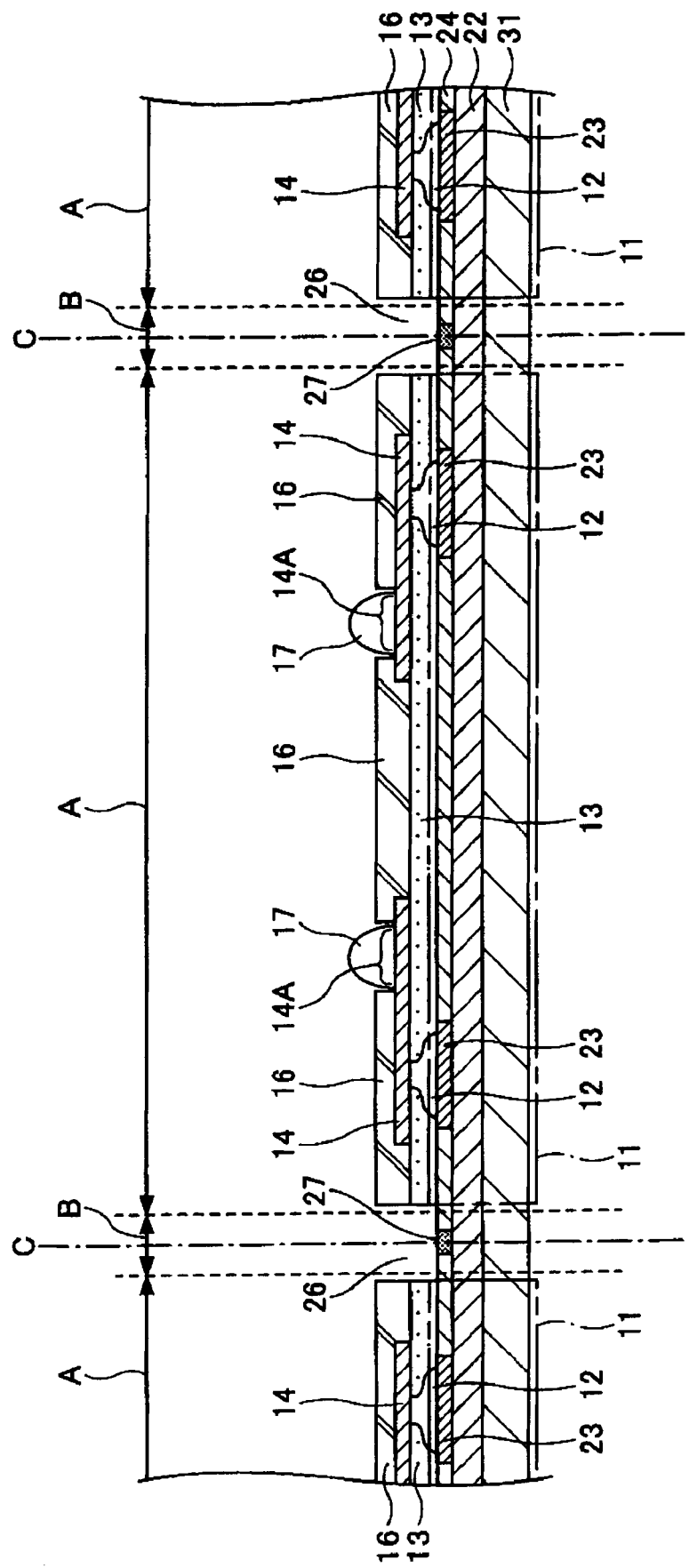
FIG. 26 is a diagram showing a manufacturing step of the semiconductor apparatus according to the first embodiment of the invention (fourteenth).

Then, in a step shown in FIG. 26, external connection terminals 17 are formed in the external connection terminal arrangement regions 14A of the wiring patterns 14. Consequently, structural bodies corresponding to the semiconductor apparatuses 10 are formed in the plural semiconductor apparatus formation regions A.

Figure 27:
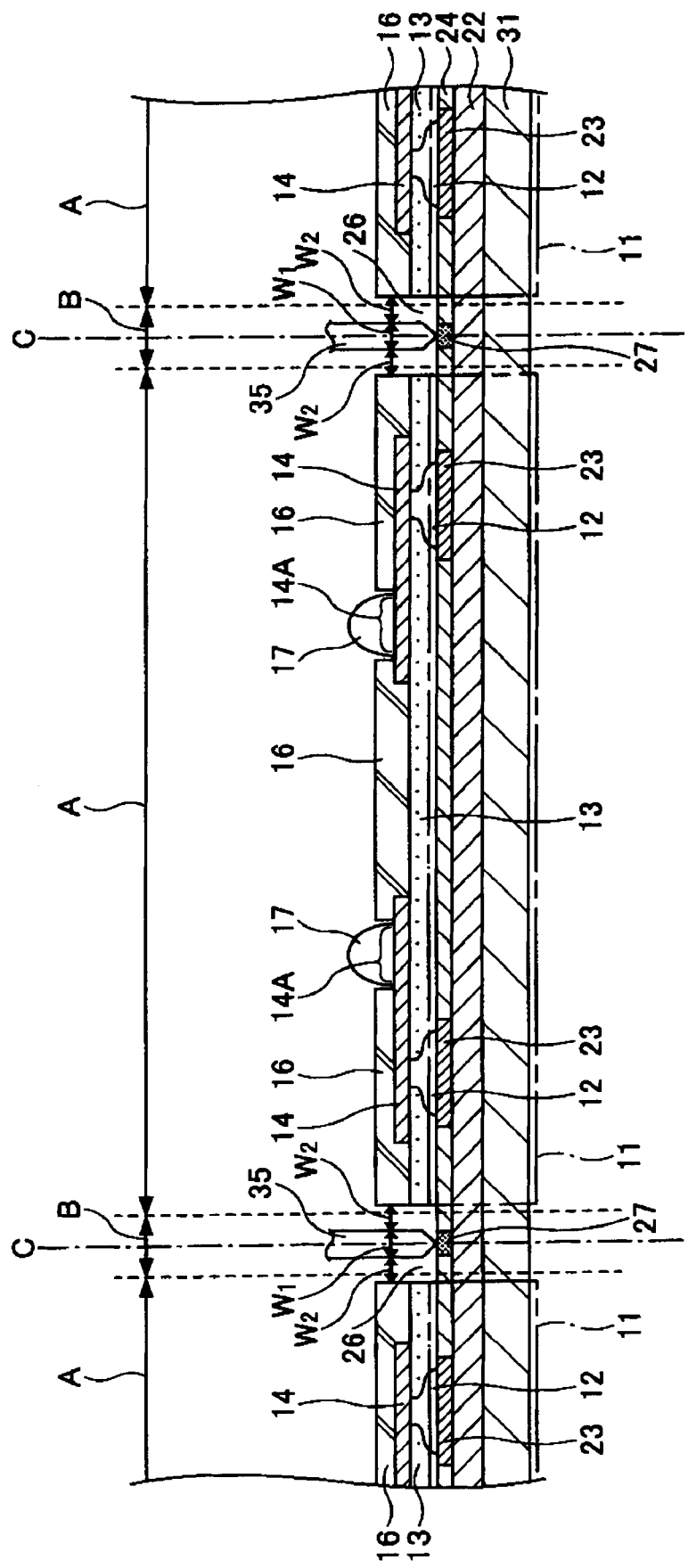
FIG. 27 is a diagram showing a manufacturing step of the semiconductor apparatus according to the first embodiment of the invention (fifteenth).

Then, in a step shown in FIG. 27, only the semiconductor substrate 31 corresponding to the scribe regions B is cut along the cut positions C (a cutting step). The semiconductor substrate 31 is cut by, for example, dicing. Here, a width $W_1$ of a dicing blade 35 is set at a width less than or equal to a width of the scribe region B. Also, for example, a positional deviation of the cut position C from the dicing blade 35 resulting from a dicing apparatus is considered and even when the positional deviation from the dicing blade 35 occurs, a gap of one side $W_2$ is disposed between a wall surface of the through groove 26 and the dicing blade 35 in order to surely cut only the semiconductor substrate 31 without making contact between the dicing blade 35 and the insulating layer 13. The width $W_1$ of the dicing blade 35 can be set at, for example, 0.04 mm. Also, the gap $W_2$ between the wall surface of the through groove 26 and the dicing blade 35 can be set at, for example, 0.08 mm.

Then, in a step shown in FIG. 28, cutting of the semiconductor substrate 31 is completed and plural semiconductor apparatuses 10 are manufactured. In addition, a step portion generated at the boundary between the semiconductor chip 11 and the insulating layer 13 in an outer peripheral part of the semiconductor apparatus 10 is generated because as described above, the positional deviation of the cut position C from the dicing blade 35 in the case of cutting the semiconductor substrate 31 is considered and even when the positional deviation from the dicing blade 35 occurs, the gap of one side $W_2$ is disposed between the wall surface of the through groove 26 and the dicing blade 35 in order to surely cut only the semiconductor substrate 31 without making contact between the dicing blade 35 and the insulating layer 13.

According to the manufacturing method of the semiconductor apparatus of the embodiment, the through groove 26 for exposing the alignment pattern 27 formed in the scribe region B is disposed in the insulating layer 13 formed on the semiconductor substrate 31, so that the alignment pattern 27 can be recognized by an exposure apparatus using a CCD camera with sufficient detection accuracy of the alignment pattern 27 without using an exposure apparatus having an infrared or X-ray transmission function with insufficient detection accuracy of the alignment pattern 27, so that accuracy of a formation position of the wiring pattern 14 with respect to the internal connection terminal 12 can be improved.

Also, by disposing the through groove 26 for exposing the alignment pattern 27 formed in the scribe region B in the insulating layer 13 formed on the semiconductor substrate 31, the alignment pattern 27 can be recognized by an exposure apparatus using an inexpensive CCD camera without using an expensive exposure apparatus having an infrared or X-ray transmission function, so that a manufacturing cost of the semiconductor apparatus 10 can be reduced.

Further, by disposing the through groove 26 for exposing the scribe region B in the insulating layer 13 formed on the semiconductor substrate 31, only the semiconductor substrate 31 is cut in the cutting step and a situation in which an interface between the semiconductor chip 11 and the protective film 24 peels is suppressed, so that a yield of the semiconductor apparatus 10 can be improved.

Second Embodiment

Figure 34:
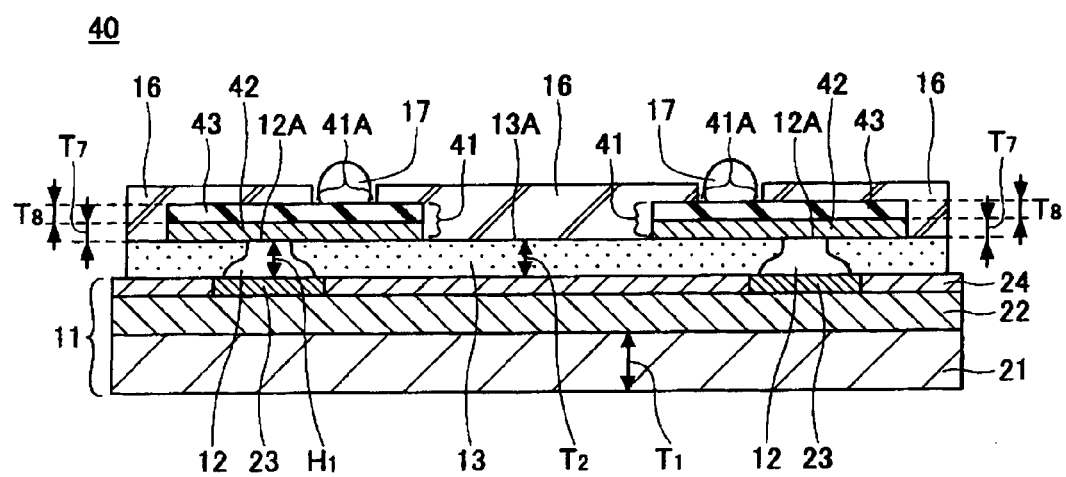
FIG. 34 is a sectional diagram of a semiconductor apparatus according to a second embodiment of the invention.

FIG. 34 is a sectional diagram of a semiconductor apparatus according to a second embodiment of the invention. In FIG. 34, the same numerals are assigned to the same components as those of the semiconductor apparatus 10 of the first embodiment. Referring to FIG. 34, a semiconductor apparatus 40 of the second embodiment is constructed in a manner similar to the semiconductor apparatus 10 except that a wiring pattern 41 made of a metal seed layer 42 and a metal film 43 is disposed instead of the wiring pattern 14 disposed in the semiconductor apparatus 10 of the first embodiment. As the metal seed layer 42, for example, a Cu layer can be used. Also, a thickness $T_7$ of the metal seed layer 42 can be set at, for example, 0.5 μm to 1.0 μm. As the metal film 43, for example, Cu can be used. Also, a thickness $T_8$ of the metal film 43 can be set at, for example, 10 μm to 20 μm.

FIGS. 35 to 46 are diagrams showing manufacturing steps of the semiconductor apparatus according to the second embodiment of the invention. In FIGS. 35 to 46, the same numerals are assigned to the same components as those of the semiconductor apparatus 40 of the second embodiment.

A manufacturing method of the semiconductor apparatus 40 of the second embodiment will be described with reference to FIGS. 35 to 46. First, in a step shown in FIG. 35, an insulating layer 13 is formed on an upper surface 25A of a support body 25. As the support body 25, for example, a tape such as a dicing tape, a resin plate or a metal plate can be used. Also, any of an optically transparent material and an optically nontransparent material may be used as the support body 25.

As the insulating layer 13, a sheet-shaped insulating resin having sticky properties (for example, an NCF (Non Conductive Film)) or a pasty insulating resin (for example, an NCP (Non Conductive Paste)) can be used. In the case of using the sheet-shaped insulating resin having sticky properties, the insulating layer 13 is formed by sticking the sheet-shaped insulating resin on the upper surface 25A of the support body 25. Also, in the case of using the pasty insulating resin as the insulating layer 13, the pasty insulating resin is formed on the upper surface 25A of the support body 25 by a printing method and thereafter is pre-baked and the insulating resin is partially cured. This partially cured insulating resin has adhesive properties. A thickness $T_4$ of the insulating layer 13 can be set at, for example, 20 μm to 100 μm.

Figure 35:
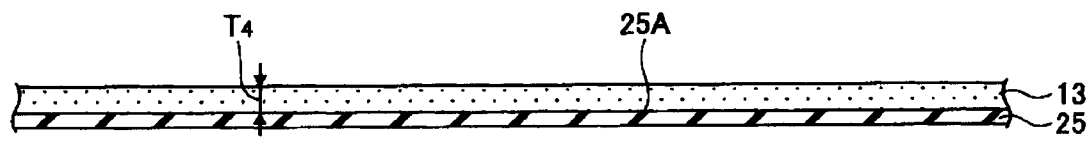
FIG. 35 is a diagram showing a manufacturing step of the semiconductor apparatus according to the second embodiment of the invention (first).
Figure 36:
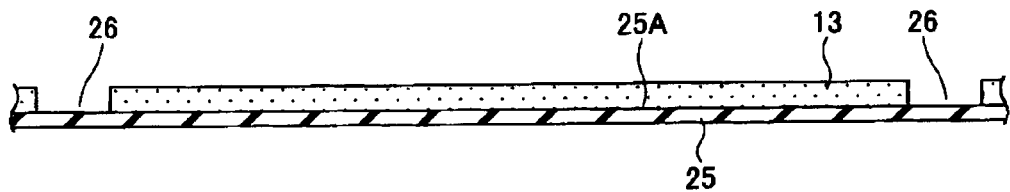
FIG. 36 is a diagram showing a manufacturing step of the semiconductor apparatus according to the second embodiment of the invention (second).

Next, in a step shown in FIG. 36, the insulating layer 13 in a structural body shown in FIG. 35 are pre-cut by, for example, dicing processing and through grooves 26 are disposed. The through groove 26 is disposed in a position in which a scribe region B disposed in a semiconductor substrate 31 is exposed in a step shown in FIG. 38 described below.

Figure 37:
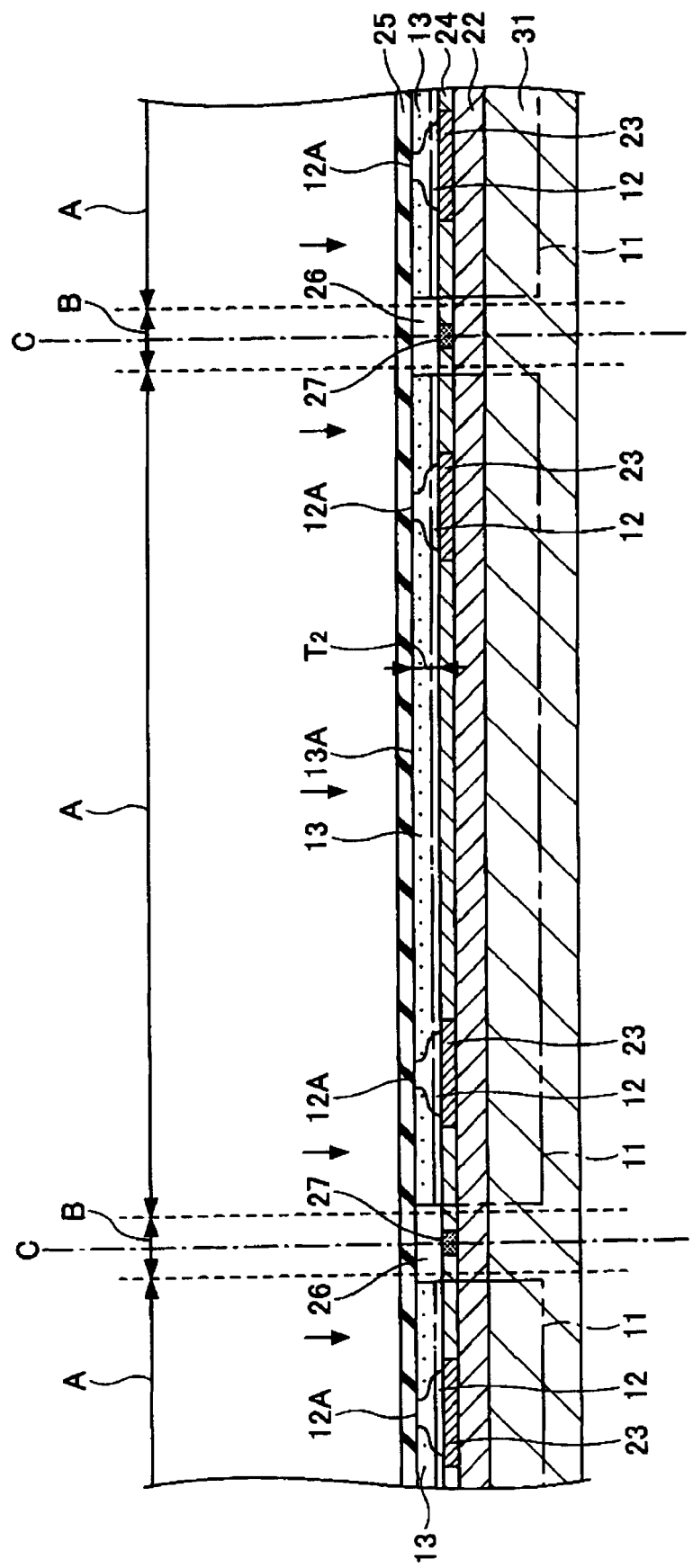
FIG. 37 is a diagram showing a manufacturing step of the semiconductor apparatus according to the second embodiment of the invention (third).

By disposing the through groove 26 corresponding to the scribe region B in which an alignment pattern 27 is formed in the insulating layer 13 thus, the alignment pattern 27 can be recognized from the front side (side in which a semiconductor integrated circuit 22 is formed) of the semiconductor apparatus 40 even after a semiconductor chip 11 and the insulating layer 13 are stuck together in a step of FIG. 37.

Then, a structural body shown in FIG. 18 is formed by performing processing similar to the steps shown in FIGS. 16 to 18 described in the first embodiment. In this stage, variations in height are present in plural internal connection terminals 12.

Then, in a step shown in FIG. 37, the insulating layer 13 is stuck on the semiconductor chip 11 so that a surface of the support body 25 (structural body shown in FIG. 36) on which the insulating layer 13 is formed is opposed to a surface of the semiconductor substrate 31 (structural body shown in FIG. 18) on which the plural semiconductor chips 11 are formed. In this case, the insulating layer 13 is stuck on the semiconductor chip 11 in a position in which the through grooves 26 of the structural body shown in FIG. 36 expose the scribe regions B of the structural body shown in FIG. 18. In the case of alignment between the scribe region B and the through groove 26, the alignment pattern 27 may be recognized by a sticking apparatus and the alignment between the scribe region B and the through groove 26 may be performed with reference to the alignment pattern 27. By together sticking the structural body shown in FIG. 36 on the structural body shown in FIG. 18 with reference to the alignment pattern 27, accuracy of a position of the through groove 26 with respect to the scribe region B can be improved.

Here, the alignment pattern 27 is covered with the support body 25, so that a sticking apparatus without having a special function can be used when the support body 25 is made of an optically transparent material, but a special sticking apparatus having a transmission function using infrared rays or X rays is required when the support body 25 is made of an optically nontransparent material.

After sticking together, in a state of heating a structural body shown in FIG. 37, the support body 25 is pressed in an arrow direction and the upper surface 13A of the insulating layer 13 is made substantially flush with upper surfaces 12A of the plural internal connection terminals 12. Also, the insulating layer 13 cures by heating the structural body shown in FIG. 37. A thickness $T_2$ of the insulating layer 13 after curing can be set at, for example, 10 μm to 60 μm.

Figure 38:
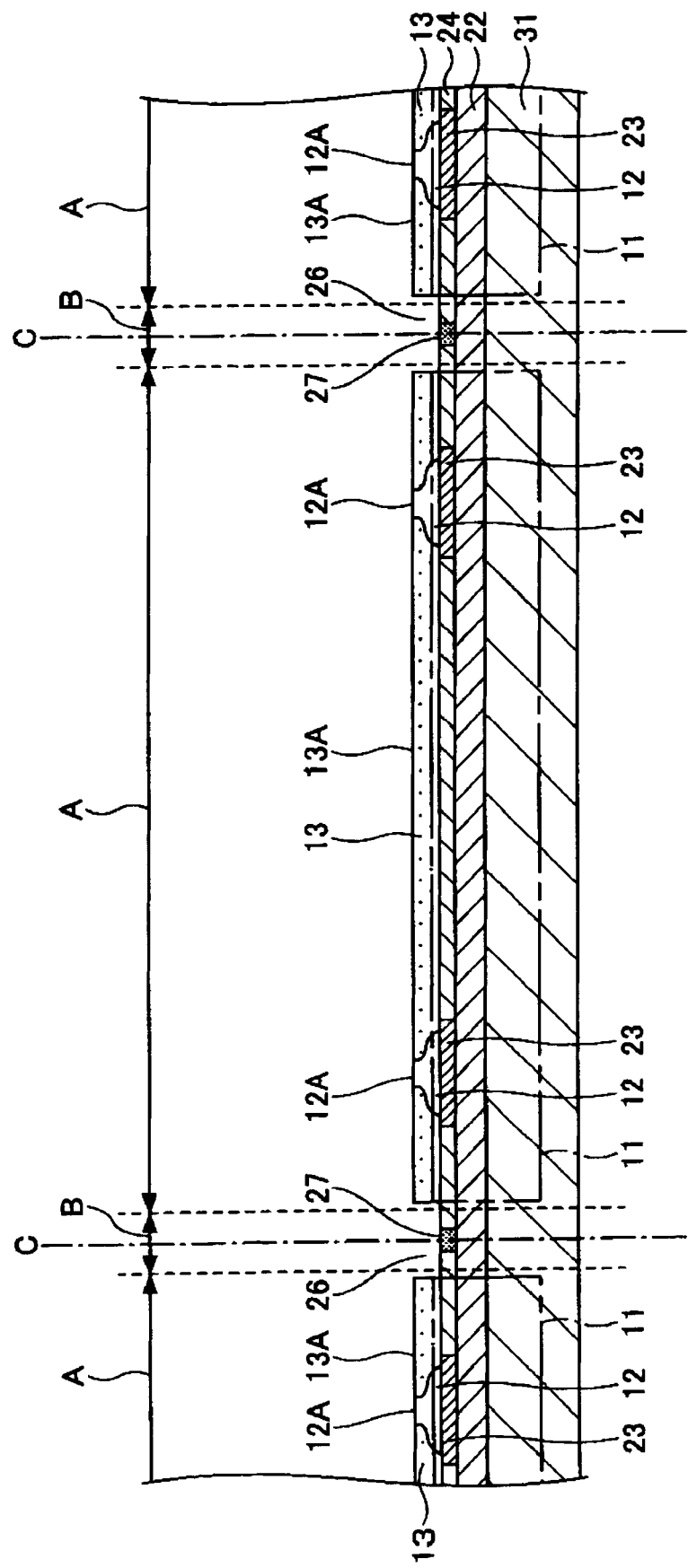
FIG. 38 is a diagram showing a manufacturing step of the semiconductor apparatus according to the second embodiment of the invention (fourth).

Then, in a step shown in FIG. 38, the support body 25 shown in FIG. 37 is removed. When the insulating layer 13 remains on the upper surfaces 12A of the internal connection terminals 12 after the support body 25 is removed, the insulating layer 13 remaining on the upper surfaces 12A is removed by dry treatment and wet treatment and the upper surfaces 12A of the internal connection terminals 12 are exposed from the insulating layer 13.

Figure 39:
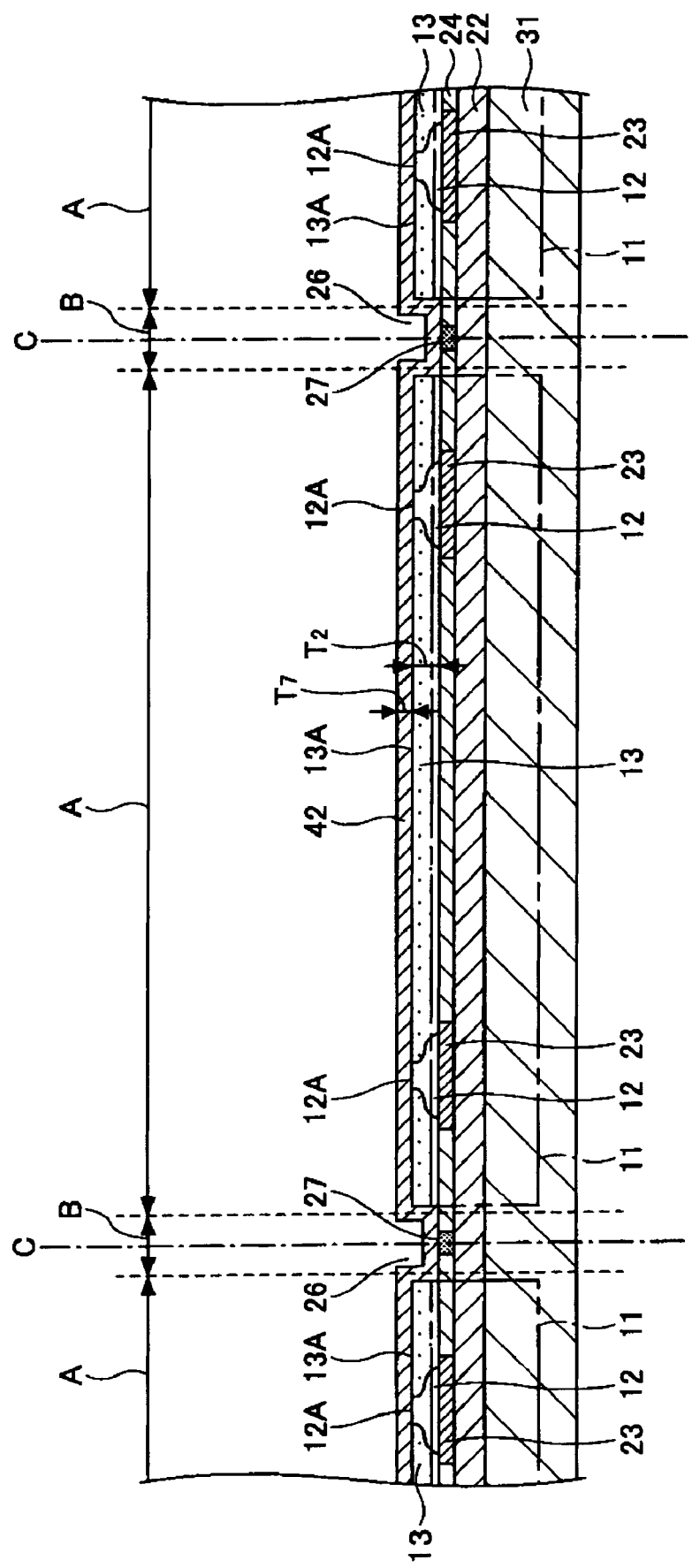
FIG. 39 is a diagram showing a manufacturing step of the semiconductor apparatus according to the second embodiment of the invention (fifth).

Then, in a step shown in FIG. 39, a metal seed layer 42 is formed by, for example, electroless plating so as to cover upper surfaces (an upper part 13A of the insulating layer 13 and a wall surface and a bottom surface of the through groove 26) of a structural body shown in FIG. 38. The metal seed layer 42 is electrically connected to the internal connection terminals 12. As the metal seed layer 42, for example, a Cu layer can be used. The thickness $T_7$ of the metal seed layer 42 can be set at, for example, 0.5 μm to 1.0 μm.

Figure 40:
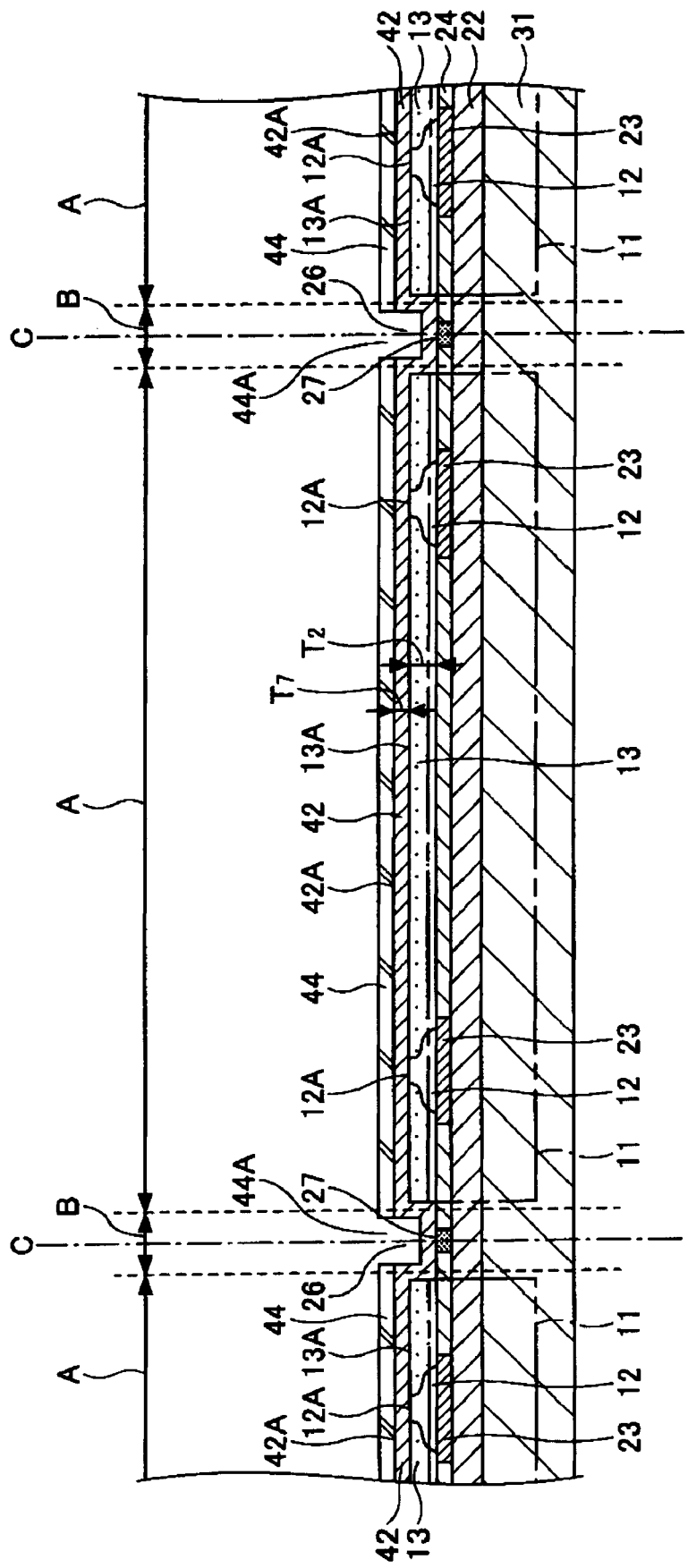
FIG. 40 is a diagram showing a manufacturing step of the semiconductor apparatus according to the second embodiment of the invention (sixth).

Then, in a step shown in FIG. 40, a resist film 44 having opening parts 44A for exposing the bottom surfaces of the through grooves 26 is formed.

Figure 41:
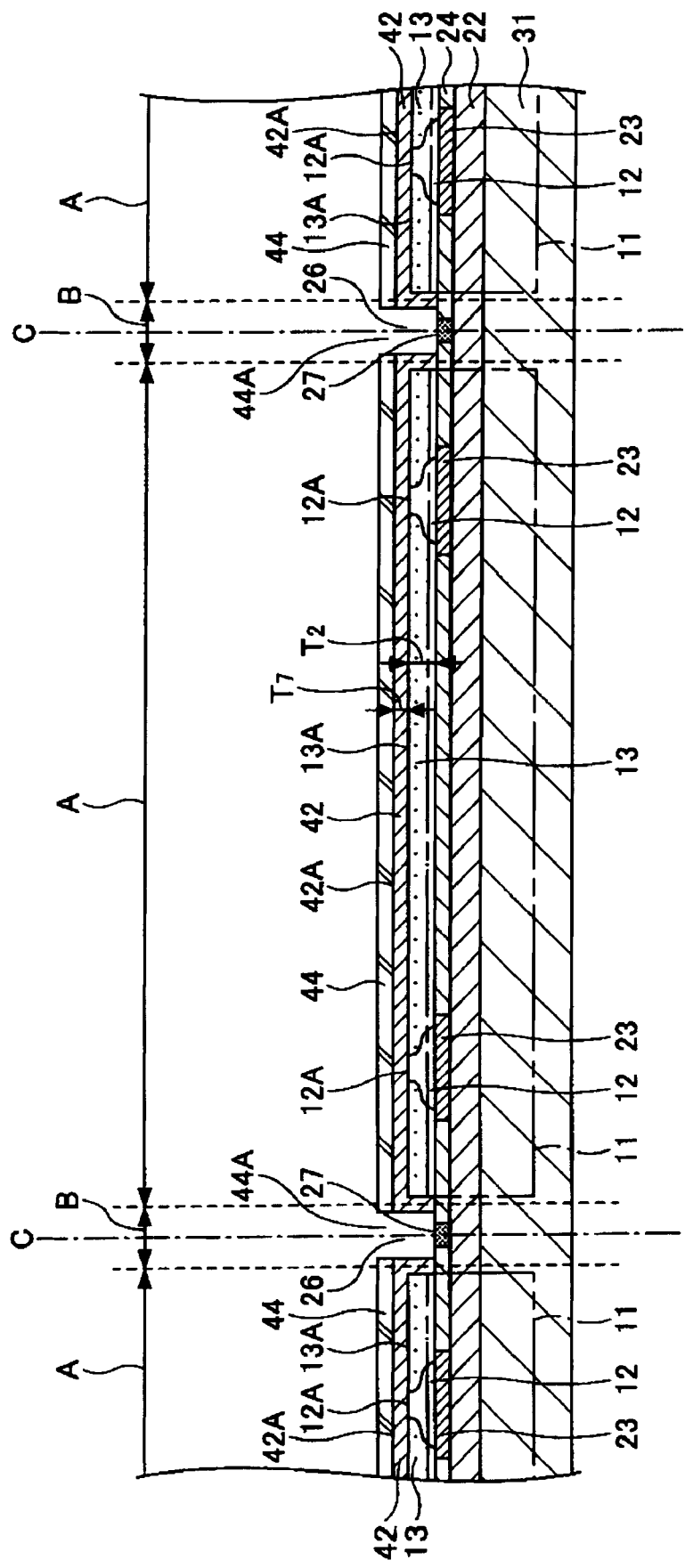
FIG. 41 is a diagram showing a manufacturing step of the semiconductor apparatus according to the second embodiment of the invention (seventh).

Then, in a step shown in FIG. 41, only the metal seed layer 42 of the portion placed in lower parts of the opening parts 44A is removed by etching. By removing only the metal seed layer 42 of the portion placed in the lower parts of the opening parts 44A thus, the alignment patterns 27 formed on the scribe regions B can be recognized from the front side of the semiconductor apparatus 40 through the through grooves 26. When a Cu layer is used as the metal seed layer 42 in this case, it is necessary to form the alignment pattern 27 by, for example, an Al layer so as not to remove the alignment pattern 27 by etching.

Figure 42:
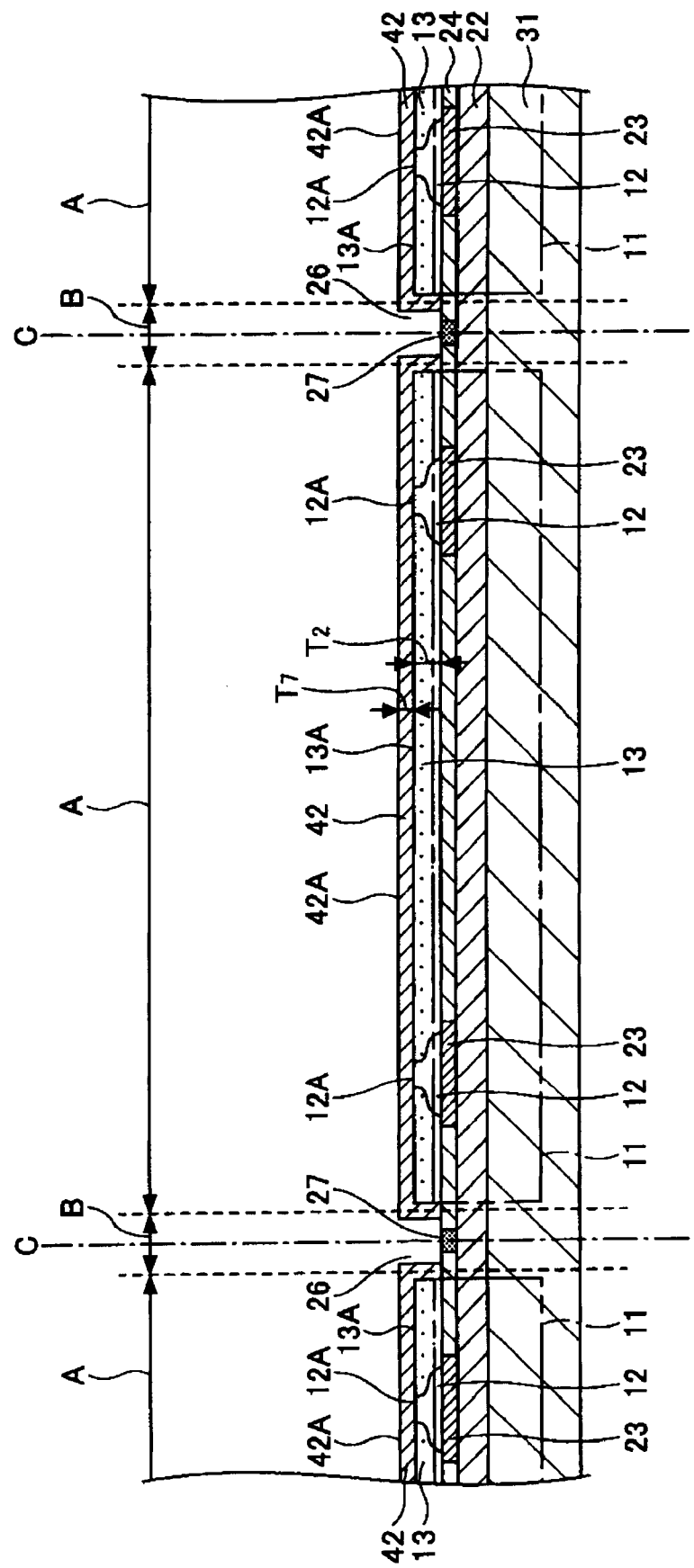
FIG. 42 is a diagram showing a manufacturing step of the semiconductor apparatus according to the second embodiment of the invention (eighth).
Figure 43:
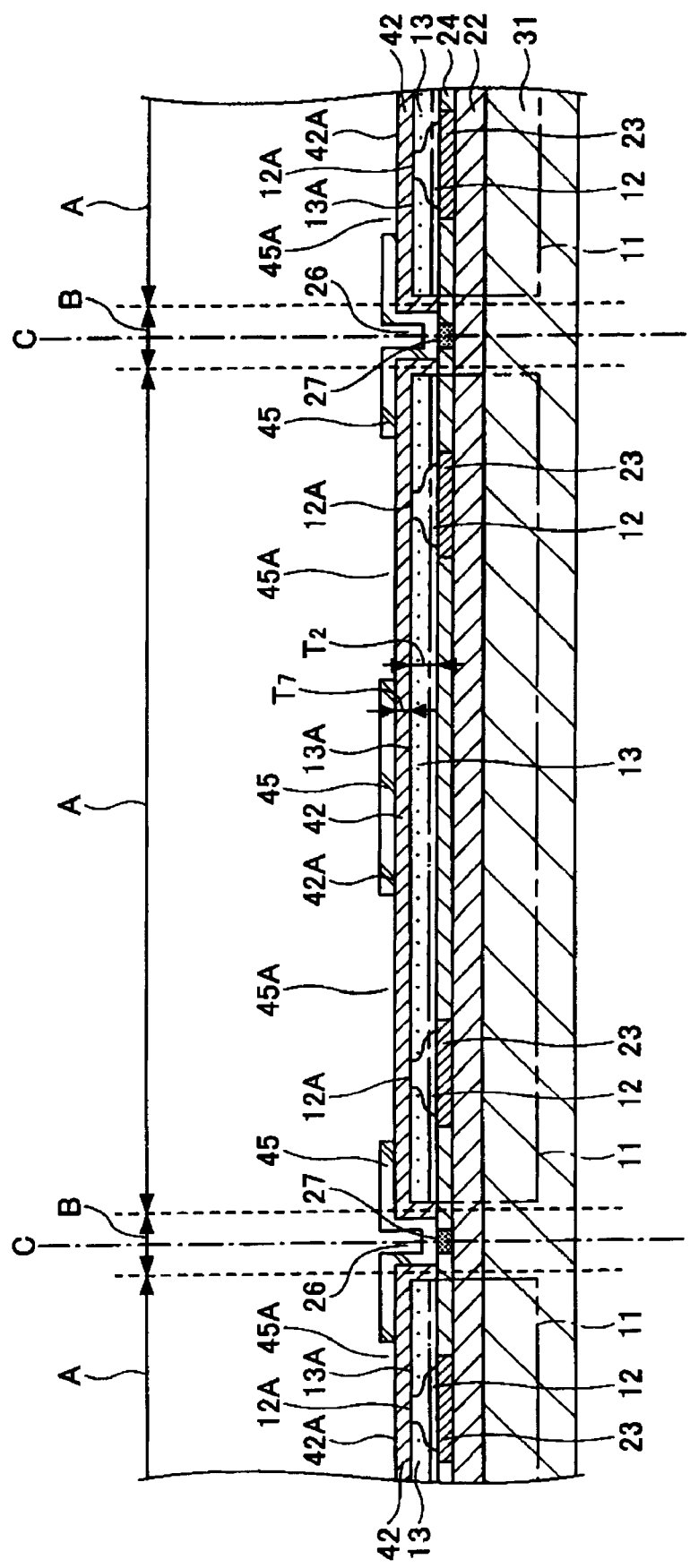
FIG. 43 is a diagram showing a manufacturing step of the semiconductor apparatus according to the second embodiment of the invention (ninth).

Then, in a step shown in FIG. 42, the resist film 44 shown in FIG. 41 is removed. Then, in a step shown in FIG. 43, a resist is applied to an upper surface 42A of the metal seed layer 42 and the resist is exposed and developed and thereby, a resist film 45 having opening parts 45A corresponding to wiring formation regions is formed. An exposure apparatus (not shown) detects a position of the alignment pattern 27 formed in the scribe region B and thereby, an exposure region of the resist is determined.

Since the through groove 26 for exposing the alignment pattern 27 formed in the scribe region B is disposed in the insulating layer 13 formed on the semiconductor substrate 31, the alignment pattern 27 can be recognized with high accuracy, so that accuracy of a position of the exposure region of the resist with respect to the internal connection terminal 12 can be improved.

Also, by disposing the through groove 26 for exposing the alignment pattern 27 formed in the scribe region B in the insulating layer 13 formed on the semiconductor substrate 31, the alignment pattern 27 can be recognized by an exposure apparatus using an inexpensive CCD camera without using an expensive exposure apparatus having an infrared or X-ray transmission function, so that a manufacturing cost of the semiconductor apparatus 40 can be reduced.

Figure 44:
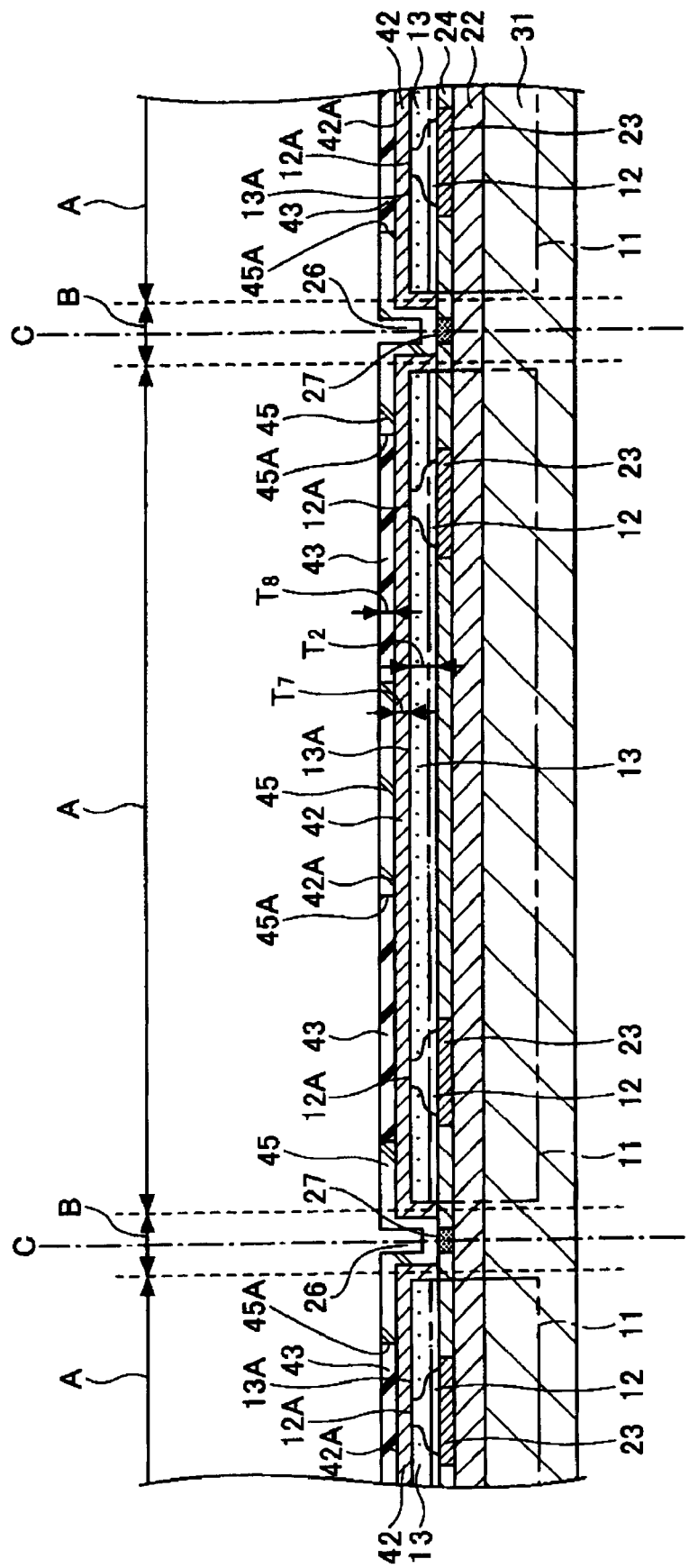
FIG. 44 is a diagram showing a manufacturing step of the semiconductor apparatus according to the second embodiment of the invention (tenth).

Then, in a step shown in FIG. 44, a metal film 43 is formed in the opening parts 45A by an electrolytic plating method using the metal seed layer 42 as a power feeding layer. The metal film 43 is electrically connected to the metal seed layer 42. As the metal film 43, for example, Cu can be used. Also, the thickness $T_8$ of the metal film 43 can be set at, for example, 10 μm to 20 μm.

Figure 45:
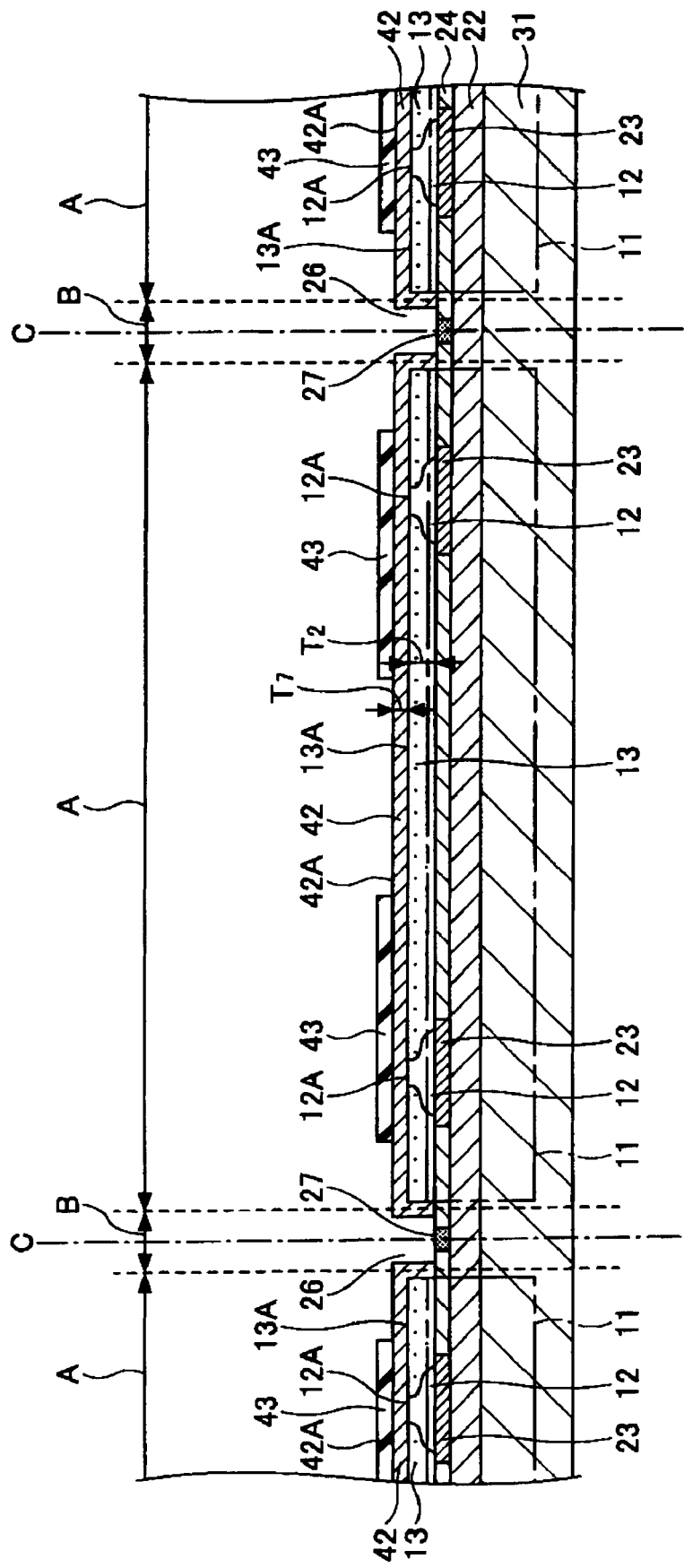
FIG. 45 is a diagram showing a manufacturing step of the semiconductor apparatus according to the second embodiment of the invention (eleventh).
Figure 46:
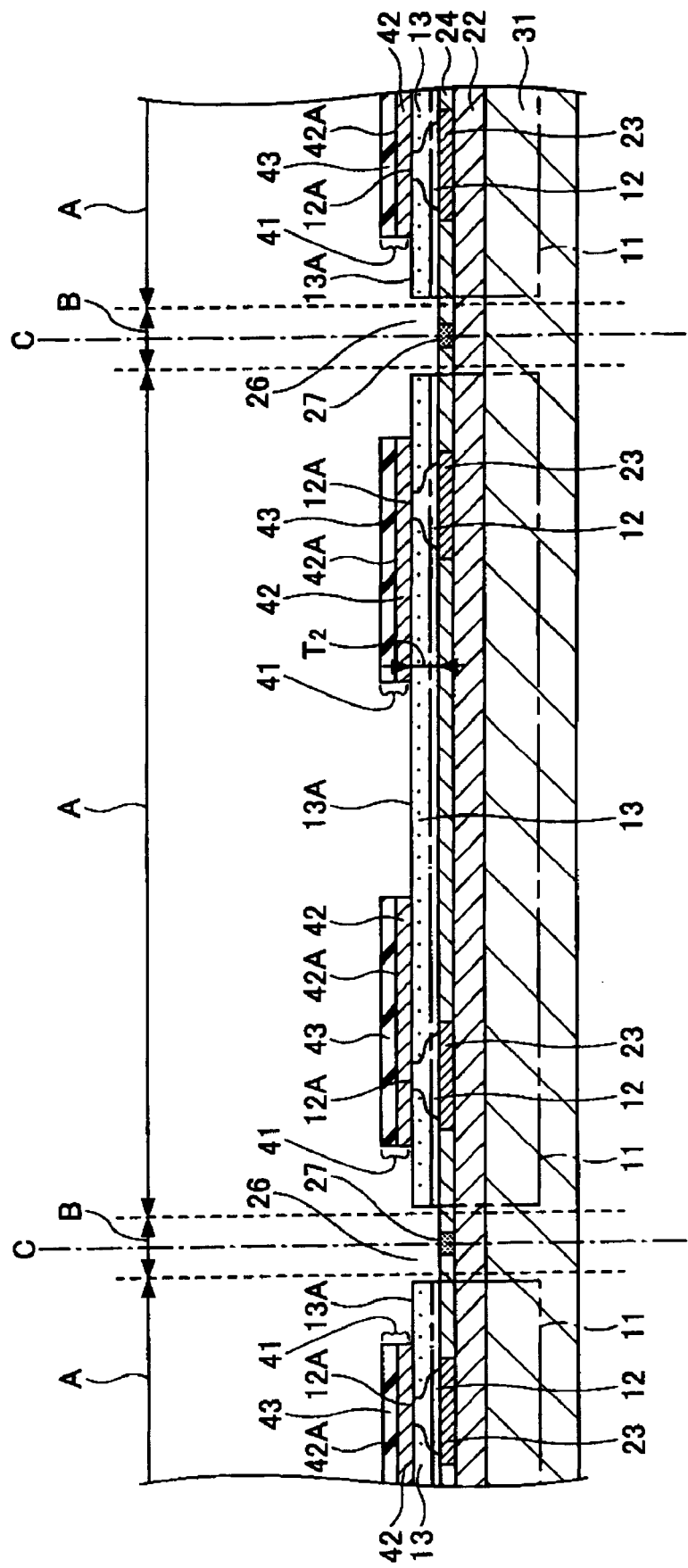
FIG. 46 is a diagram showing a manufacturing step of the semiconductor apparatus according to the second embodiment of the invention (twelfth).

Then, in a step shown in FIG. 45, the resist film 45 shown in FIG. 44 is removed. Then, in a step shown in FIG. 46, a wiring pattern 41 made of the metal seed layer 42 and the metal film 43 is formed by removing the metal seed layer 42 of a region in which the metal film 43 is not formed by etching (a wiring pattern formation step). As shown in FIGS. 39 to 46, an example of forming the wiring patterns 41 by a semi-additive method is shown in the embodiment.

Then, the semiconductor apparatus 40 shown in FIG. 34 is manufactured by performing processing similar to the steps shown in FIGS. 24 to 28 described in the first embodiment.

According to the manufacturing method of the semiconductor apparatus of the embodiment, dimension accuracy of the wiring pattern 41 can be improved since the wiring pattern 41 is formed by the semi-additive method. In addition, the manufacturing method of the semiconductor apparatus 40 of the embodiment can obtain an effect similar to that of the manufacturing method of the semiconductor apparatus 10 of the first embodiment.

The preferred embodiments of the invention have been described above in detail, but the invention is not limited to the embodiments described above and can add various modifications and substitution to the embodiments described above without departing from the scope of the invention.

The invention can be applied to a manufacturing method of a semiconductor apparatus with substantially the same size as that of a semiconductor chip in a state of being viewed from the plane in which flip chip bonding between the semiconductor chip and a wiring pattern is made.

What is claimed is:

1. A manufacturing method of a semiconductor apparatus, said method comprising:
    a semiconductor chip formation step of forming a plurality of semiconductor chips in a plurality of semiconductor chip formation regions of a semiconductor substrate;
    an alignment pattern formation step of forming alignment patterns in scribe regions placed between the semiconductor chip formation regions of the semiconductor substrate;
    an internal connection terminal formation step of forming internal connection terminals on electrode pads of the semiconductor chips;
    an insulating layer formation step of forming an insulating layer having through grooves on the semiconductor substrate on which the semiconductor chips are formed in a state that the through grooves are opposed to the scribe regions of the semiconductor substrate;
    a metal layer formation step of forming a metal layer on the insulating layer, the metal layer having through grooves aligned with the through grooves formed on the insulating layer;
    a wiring pattern formation step of aligning formation positions of wiring patterns to be electrically connected to the internal connection terminals based on the alignment patterns and patterning the metal layer based on the formation positions and forming the wiring patterns; and
    a cutting step of cutting the semiconductor substrate of a portion corresponding to the scribe regions exposed by the through grooves of the insulating layer after the wiring pattern formation step.

2. A manufacturing method of a semiconductor apparatus as claimed in claim 1, wherein the electrode pads of the semiconductor chips are formed in the same step with the alignment patterns.

3. A manufacturing method of a semiconductor apparatus as claimed in claim 1, wherein the insulating layer formation step includes forming the insulating layer on a support body, forming the through grooves in the insulating layer, stacking the insulating layer on the semiconductor chip in a state that a surface of the support body on which the insulating layer is formed is opposed to a surface of the semiconductor substrate on which the semiconductor chips are formed, and thereafter removing the support body from the insulating layer.

4. A manufacturing method of a semiconductor apparatus as claimed in claim 1, wherein the metal layer and the insulating layer are sequentially formed to a support body, the through grooves are formed in the insulating layer, and the insulating layer is stuck on the semiconductor chip in a state that a surface of the support body on which the metal layer and the insulating layer are formed is opposed to a surface of the semiconductor substrate on which the semiconductor chips are formed, and thereafter the support body is removed.

5. A manufacturing method of a semiconductor apparatus as claimed in claim 1, wherein in the insulating layer formation step, alignment between a position of the through groove and a position of the scribe region of the semiconductor substrate is performed based on the alignment pattern.

* * * * *